(12) United States Patent
Kawajiri et al.

(10) Patent No.: US 6,448,596 B1
(45) Date of Patent: Sep. 10, 2002

(54) SOLID-STATE IMAGING DEVICE

(75) Inventors: Kazuhiro Kawajiri; Takashi Miida, both of Kanagawa (JP)

(73) Assignee: Innotech Corporation (JP)

( * ) Notice: Subject to any disclaimer, the term of this patent is extended or adjusted under 35 U.S.C. 154(b) by 0 days.

(21) Appl. No.: 09/928,508

(22) Filed: Aug. 14, 2001

(30) Foreign Application Priority Data

Aug. 15, 2000 (JP) ........................................ 2000-246411
Nov. 22, 2000 (JP) ........................................ 2000-356658

(51) Int. Cl.[7] ...................... H01L 31/062; H01L 31/113
(52) U.S. Cl. ....................... 257/292; 257/291; 257/401
(58) Field of Search ................................. 257/291, 292, 257/401, 402

(56) References Cited

U.S. PATENT DOCUMENTS

| 4,901,129 A | | 2/1990 | Hynecek .................. 357/30 |
| 5,625,210 A | | 4/1997 | Lee et al. .................. 257/292 |
| 6,051,447 A | * | 4/2000 | Lee et al. .................. 438/48 |
| 6,051,857 A | | 4/2000 | Miida .................. 257/292 |
| 6,100,556 A | * | 8/2000 | Drowley et al. ........... 257/292 |

FOREIGN PATENT DOCUMENTS

| JP | 60-140752 | 7/1985 |
| JP | 60-206063 | 10/1985 |
| JP | 2-304973 | 12/1990 |
| JP | 6-120473 | 4/1994 |

* cited by examiner

*Primary Examiner*—Ngân V. Ngô
(74) *Attorney, Agent, or Firm*—Lorusso & Loud

(57) ABSTRACT

The present invention relates to a solid-state imaging device. More specifically, the invention relates to the solid-state imaging device, which uses a MOS image sensor of a threshold voltage modulation system used for a video camera, an electronic camera, an image input camera, a scanner, a facsimile or the like. The solid-state imaging device is constructed in a manner that pixels are arrayed in a matrix form. Each pixel includes: a photo-diode for generating photo-generated charges by light irradiation; and an insulated gate field effect transistor for light signal detection, provided adjacently to the photo-diode, for storing the photo-generated charges beneath a channel region under a gate electrode, and modulating a threshold voltage by the stored photo-generated charges to detect a light signal. The gate electrodes are disposed at at least four directions around a periphery of the photo-diode, and the photo-diodes are disposed at at least four directions around a periphery of the gate electrode.

18 Claims, 27 Drawing Sheets

Photo-Generated Hole 72a, 72b : HSCAN Supply Line
102 : VSCAN Scanning Driver Circuit
107 : Video Signal Output Terminal
112 : MOS Transistor for Light Signal Detection

SOLID-STATE IMAGING DEVICE

BACKGROUND OF THE INVENTION

1. Field of the Invention

The present invention relates to a solid-state imaging device, which uses the MOS image sensor of a threshold voltage modulation type used for a video camera, an electronic camera, an image input camera, a scanner, a facsimile or the like.

2. Description of the Related Art

As mass productivity is high for a semiconductor image sensor, e.g., a CCD image sensor, a MOS image sensor, and so on, the semiconductor image sensor has been used for almost all imaging devices with the progress made in a fine pattern technology.

In recent years, particularly the MOS image sensor has been reevaluated because it is advantageous in that power consumption is small compared with the CCD image sensor, and a sensor device and a peripheral circuit device can be manufactured by the same CMOS technology.

In line with such a tendency, the inventors made improvements on the MOS image sensor, and filed the application for a patent regarding a sensor device having a carrier pocket (heavily doped buried layer) 25 below the channel region of an insulated gate field effect transistor for light signal detection (hereinbelow, referred to as PXMOSFET) (Japanese Patent Application Hei 10 (1998)-186453). A patent therefor has been granted (registered No. 2935492).

The described MOS image sensor has a structure shown in FIGS. 1 and 2: FIG. 1 being a plan view; and FIG. 2 being a sectional view taken on line I—I of FIG. 1. In this structure as shown in FIGS. 1 and 2, a unit pixel 101 is composed of a photo-diode 111, and a PXMOSFET 112 adjacent to the photo-diode 111. The MOS image sensor is constructed by arraying such pixels 101 in a matrix form. The photo-diode 111 and the PXMOSFET 112 are communicated by p-type well regions 15a and 15b. In the PXMOSFET 112, a gate electrode 19 has a ring shape, an n-type source region 16 is formed in the center thereof, and an n-type drain region 17a is formed to surround the outer periphery of the gate electrode 19. A p-type hole pocket 25 is formed to surround the source region 16 in the well region 15b near the source region, below the gate electrode 19.

Adjacent pixels 101 are isolated from each other by a pixel isolation region. The pixel isolation region is composed of an insulating isolation region 14 formed in a substrate surface by a local oxidation of silicon (LOCOS) method, and a p-type diffusing isolation region 13 formed in a semiconductor substrate provided below the insulating isolation region 14.

During initialization period in the MOS image sensor, a high positive voltage is applied to each electrode to be depleted to sweep photo-generated holes remaining in the hole pocket 25 to the substrate. During storing period, the photo-diode 111 is irradiated with a light collected by a microlens to generate photo-generated holes, and then the holes are moved to be stored in the hole pocket 25. Then, during reading period, a light signal is detected by detecting the threshold voltage of the PXMOSFET 112 modulated in proportion to the stored amount of photo-generated holes.

In the solid-state imaging device, the pixel isolation region formed by the LOCOS method is not suited for microfabrication of pixel 101 with respect to the structure. Thus, a further improvement may be required in order to meet a request for the microfabrication possibly made with a higher definition of an image in the future.

When a pixel pitch is reduced to achieve a higher density of a pixel array, since the structure of the peripheral part of the gate electrode 19 is complex compared with the photo-diode 111, a reduction rate of the gate electrode 19 is limited compared with that of the photo-diode 111. Consequently, at present or in the near future, an area of the gate electrode 19 may become to account for more than seventy percent to a total area of a pixel.

In the case of reducing a pixel pitch while maintaining an area of a light-detecting portion as wider as possible under such circumstances, the light-detecting portion of the photo-diode 111 is to be formed in a thin and long rectangular shape. Thus, if a light collection method by the microlens is applied, there may be caused a situation that an optical spot diameter is out of the light-detecting portion in the short side direction of the same finally as microfabrication is further advanced. In such a case, the quantity of incident light becomes short in both ends of the short side direction. Consequently, an output from the image sensor provably decreases and outputs between pixels provably results in a lack of uniformity even when a uniform pattern is photographed.

In addition, in the imaging device using the CCD device, resolution is improved by employing the three-plate system in which three CCD elements are arranged corresponding to primary colors separated by a prism. On the other hand, in the MOS image sensor, there has been expected an improvement of resolution by a single-plate system in which a light signal including primary colors is obtained with one imaging device element using a color filter. That leads to a good use of the features of the MOS image sensor, i.e., low power consumption, and a compact size.

SUMMARY OF THE INVENTION

The present invention provides a solid-state imaging device having a structure suited for microfabrication of a pixel, and capable of miniaturizing the imaging device as a whole.

It is an object of the present invention to provide a solid-state imaging device capable of improving resolution by a single-plate system.

Moreover, it is an object of the present invention to provide a solid-state imaging device having more effective pixel arrangement in preventing a decrease of output and a lack of uniformity of outputs among pixels.

The formation of an insulating film by a local oxidation of silicon (LOCOS) method is disadvantageous for microfabrication because the region for forming an isolation insulating film is expanded by an amount of more than a mask size due to the formation of bird's beak.

According to the present invention, as shown in FIGS. 3, 4A, 4C, 5, and 6, a pixel isolation region for isolating adjacent pixels 101 from each other is provided with a diffusing isolation region 53 having same conductivity as a drain region 57a. The diffusing isolation region 53 is formed deeper than the well regions 54a and 54b to contact the regions 52a and 52b under the well regions 54a and 54b while the diffusing isolation region 53 contact the impurity region 57 and the drain region 57a above the well regions 54a and 54b. Therefore, the well regions 54a and 54b are surrounded in the entire periphery thereof by the impurity region 57, the drain region 57a, the regions 52a and 52b and the diffusing isolation region 53. And during operating such imaging device, the photo-generated charges in the well regions 54a and 54b cannot move out of the well regions 54a and 54b due to a potential generated in the pn junction. In such manner, adjacent pixels can be separated from each other by the diffusing isolation region 53.

In other words, since the pixel isolation is carried out only by the diffusing isolation region 53 without using any isolation insulating films by the LOCOS method, no bird's beak is formed to prevent the pixel isolation region from being expanded by an amount more than the mask size. Thus, the pixel 101 can be microfabricated, and thus the imaging device is miniaturized as a whole.

In the solid-state imaging device of the present invention, pixels 101, each thereof having a PXMOSFET 112, are arrayed in a matrix form, a plurality of gate electrodes 59 of PXMOSFETs 112 are disposed at at least four directions among the peripheral part of a photodiode 111, and a plurality of photo-diodes 111 are disposed at at least four directions among the peripheral part of the gate electrode of the PXMOSFET 112. In this case, one pixel 101 is provided with the ring-shaped gate electrode 59, in which a planar shape of the outer peripheral part thereof is formed to be polygonal having four or more sides, alternately circular. One pixel 101 is provided as well with the photo-diode 111 which is formed adjacently to at least one side of the polygonal shape or a part of the circumference of the circular shape of the gate electrode 59.

FIG. 7 is an example of above arrangement. The components inside the pixel 101 may be arranged such that a direction from the gate electrode 59 to the photo-diode 111 can coincide with an oblique direction with respect to a row and a column directions, and the pixels may be arrayed in a matrix form. FIGS. 11, 12, 14 and 15 are examples of such arrangement. In other words, the photo-diode 111 is disposed among so-called lattices composed of row-directed lines of the gate electrode 59 and column-directed lines of the same. Accordingly, it is possible to facilitate the formation of a photo-diode 111 provided with a light-detecting portion having so-called isotropic expansion, i.e., in which a ratio of short and long sides of a light-detecting portion having, e.g., a square shape, approaches 1 while the forming area of the gate electrode 59 is secured.

In FIG. 8, the light-detection portions are arranged with a pitch Pr on the same column-directed line, and the light-detection portions are arranged with a pitch Pc on the same row-directed line. A shift of 1/2Pc occurs between the adjacent row-directed lines, and a shift of 1/2Pr occurs between the adjacent column-directed lines.

This arrangement corresponds to FIGS. 17, 18, 19 and 20. In FIGS. 18, 19 and 20, the components inside the pixel 101 are arranged such that a direction from the gate electrode 59 to the photo-diode 111 can coincide with a parallel direction with respect to the row or column direction, and adjacent pixels are arranged such that the directions from the gate electrode 59 to the photo-diode 111 turn to the same directions. In FIG. 17, adjacent pixels are arranged such that the directions from the gate electrode 59 to the photo-diode 111 turn to the opposite directions.

In other words, the gate electrode 59 and the photo-diodes 111 are arranged alternately on the row-directed line and the column-directed line. Accordingly, a row pitch and a column pitch can be scaled down while securing a forming area of the photo-diode 111 provided with a light-detecting portion having so-called isotropic expansion and a sufficient forming area of the gate electrode 59.

In the case of FIG. 21 where pixels are arranged without any contrivance, an irradiation optical spot is moved out of the light-detecting portion to cause a reduction in the output of an optical electric signal from the pixel. On the other hand, in the above pixel arrangement of the present invention, since the photo-diode 111 provided with a light detecting portion having more isotropic expansion is obtained, an irradiation optical spot is set in the light detecting portion as shown in FIGS. 22A and 22B. Thus, it is possible to prevent a reduction in the output of an optical electric signal from the pixel and a lack of uniformity of outputs among pixels, which are caused by the case where the irradiation optical spot can no longer be fit on the light-detecting portion.

In addition, in the planar arrangement of the pixels 101 in the solid-state imaging device, as shown in FIGS. 17 to 20, the gate electrodes 59 with respect to the photo-diodes 111 belonging to adjacent row-directed lines are sequentially connected to form the one row. The arrangement of the photo-diodes 111 in the one row shapes in a zigzag manner along the row direction. This zigzag arrangement results in a same advantage as so-called pixel shifting in the solid-state imaging device of the three-plate system using a CCD device. In other words, a pitch between adjacent row lines substantially becomes narrower than the row pitch Pr compared with no pixel shifting, so that a light signal irradiated between the rows with pitch Pr is captured as well. Accordingly, resolution can be enhanced in the single-plate system.

The pixel arrangements as shown in FIG. 9 and FIG. 10 as well are in a scope of the present invention. Both arrangements are similar to FIG. 8. In FIG. 9, the pitch of the photo-diodes 111 on the row-directed line is wider than that in the regular arrangement. In FIG. 10, the pitch of the photo-diodes 111 on the column-directed line is wider than that in the regular arrangement. Accordingly, since the forming area of the gate electrode can be taken wider, these arrangements are advantageous for case that there is a need for an increase of an amount of photo-generated carriers stored in the heavily doped buried layer while the row pitch or the column pitch is scaled down.

DESCRIPTION OF THE PREFERRED EMBODIMENTS

Next, the preferred embodiments of the present invention will be described with reference to the accompanying drawings.

(First Embodiment)

Figure 1:
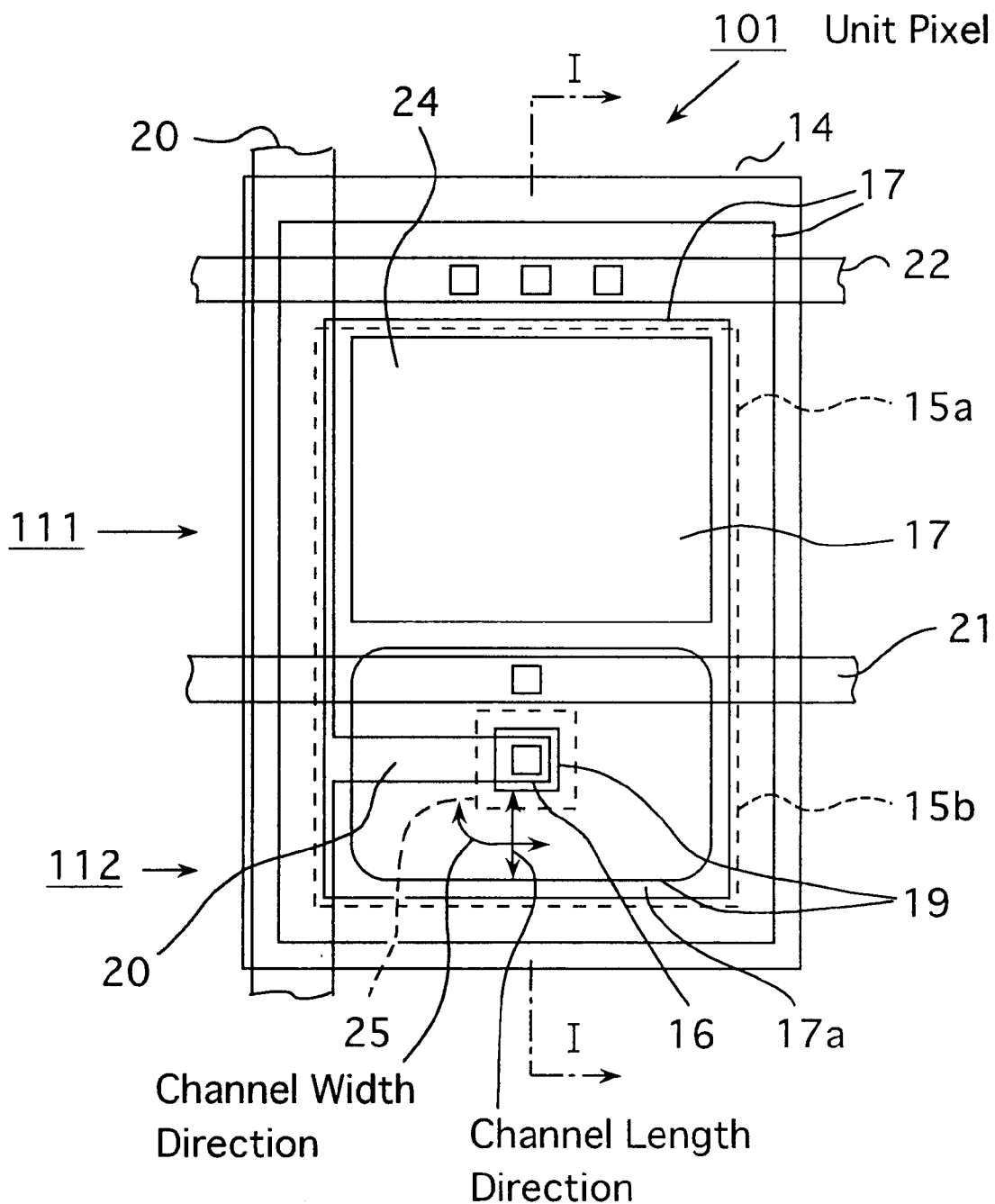
FIG. 1 is a plan view showing an element layout in a unit pixel of a solid-state imaging device of the related art.
Figure 2:
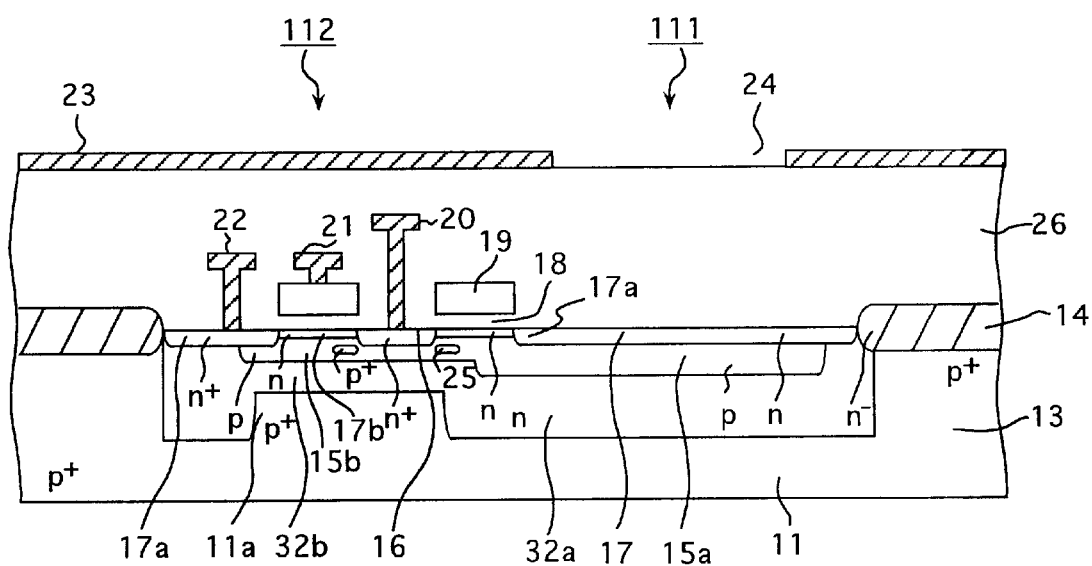
FIG. 2 is a sectional view taken on line I—I of FIG. 1.
Figure 3:
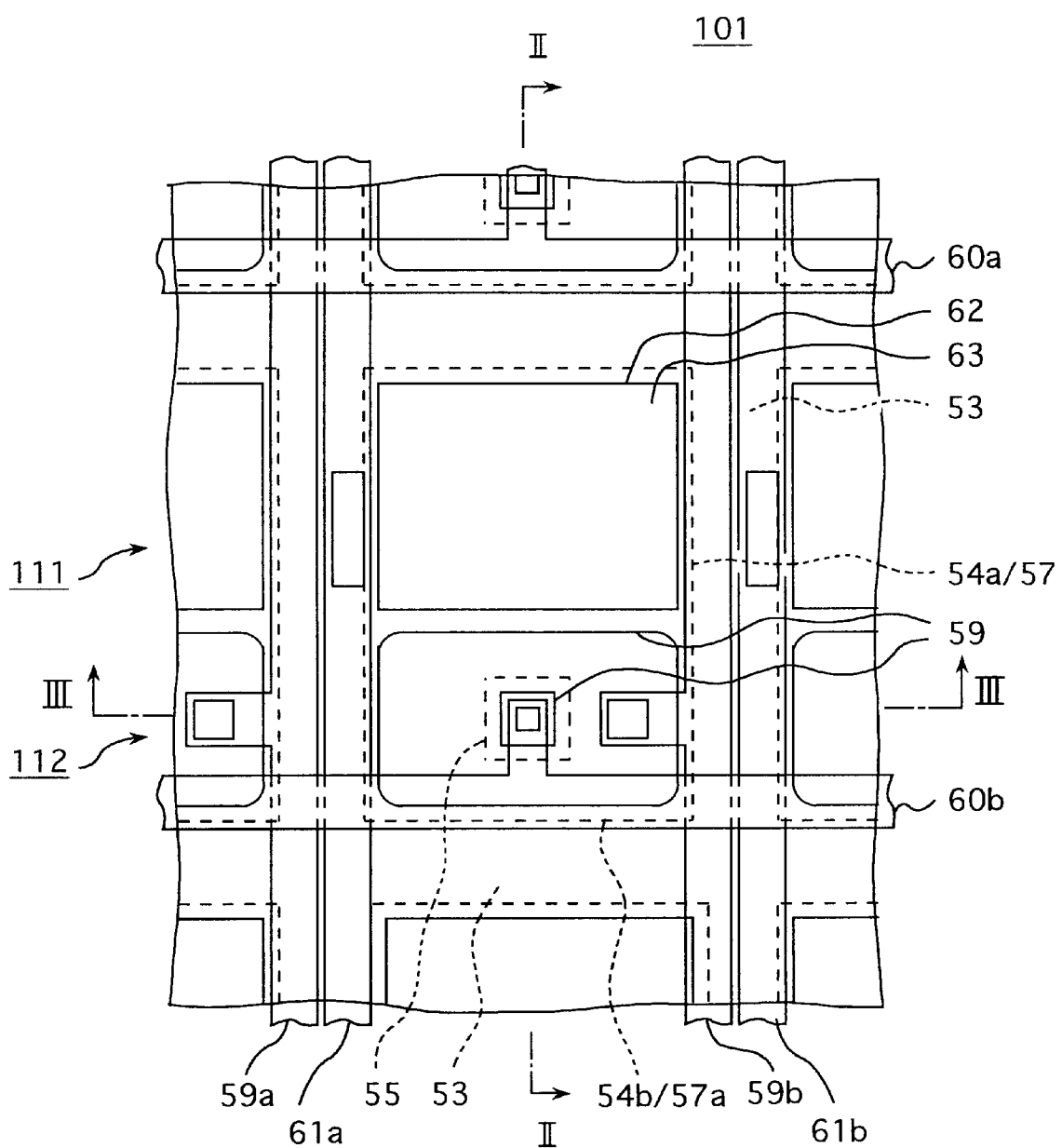
FIG. 3 is a plan view showing an element layout in a unit pixel of a solid-state imaging device according to a first embodiment of the present invention.

FIG. 3 is a plan view showing an element layout in a unit pixel of a MOS image sensor according to the first embodiment of the present invention.

As shown in FIG. 3, a pixel 101 includes a photo-diode 111 and a insulated gate field effect transistor for light signal detection (hereinbelow referred to as PXMOSFET) 112 provided adjacently to each other. For the PXMOSFET 112, an n channel MOS (nMOS) is used. The pixel 101 is formed in a rectangular shape, and surrounded, without any gaps, with a pixel isolation region having a series of a diffusing isolation region 53.

A gate electrode 59 in the PXMOSFET 112 is formed in a square-like ring shape. A source region 56 is provided inside the inner peripheral part of the gate electrode 59, and a drain region 57a is provided outside the outer peripheral part of the gate electrode 59.

The drain region 57a is extended to form an impurity region 57 of the photo-diode 111. Further, the impurity region 57 and the drain region 57a are extended to the peripheral part of the pixel 101, and connected to the diffusing isolation region 53 surrounding the pixel 101.

In addition, a carrier pocket (heavily doped buried layer) 55 as a feature of the MOS image sensor is formed to surround the source region 56, in a partial region of a channel length direction from the drain region 57a to the source region 56, and in a entire region of a channel width direction.

The gate electrode 59 is connected to vertical scanning signal (VSCAN) supply lines 59a, 59b, . . . , and the source region 56 is connected to vertical output lines (or source electrodes) 60a, 60b, . . . . The vertical scanning signal (VSCAN) supply lines 59a, 59b, . . . , and the vertical output lines (or source electrodes) 60a, 60b, . . . , are extended in directions intersecting each other.

Further, the drain voltage (VDD) supply lines (or drain electrodes) 61a, 61b, . . . , which extends parallel to the vertical scanning signal (VSCAN) supply lines 59a, 59b, . . . , is provided on the diffusing isolation region 53 to contact the diffusing isolation region 53 at each pixel site. Consequently, the drain voltage (VDD) supply lines (or drain electrodes) 61a, 61b, . . . is connected to the drain region 57a of each pixel 101. In this manner, potential differences of drain voltages among pixels 101 can be minimized and thus the imaging device can be driven uniformly.

In addition, the foregoing components are covered with an insulating film such as a silicon oxide film or the like, and the region other than the light-detecting window 63 of the photo-diode 111 is shielded from light by a metallic layer (light-shielding film) 62 formed on the insulating film.

Next, description will be made of the device structure of the MOS image sensor of the embodiment of the invention by referring to the sectional views.

Figure 4A:
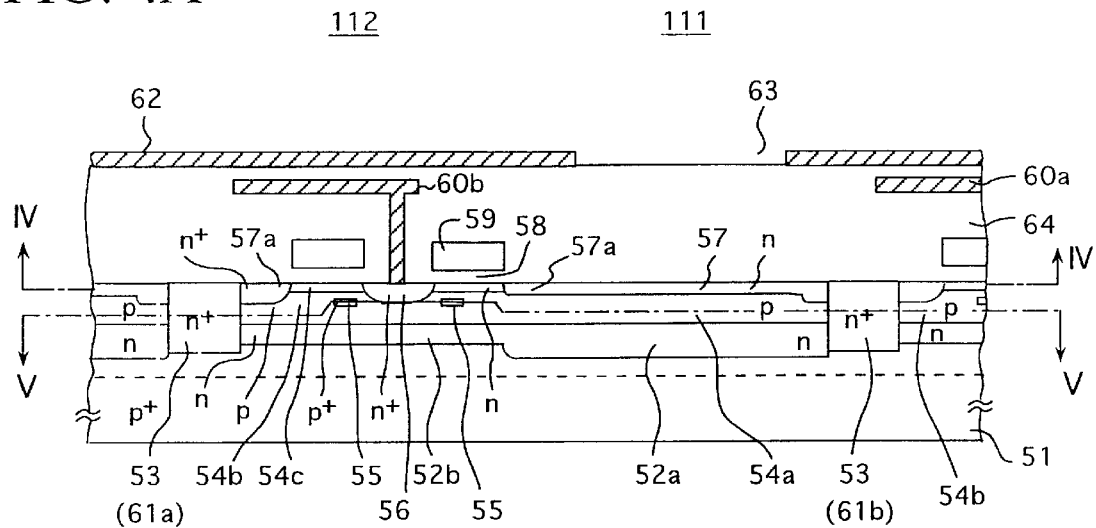
FIG. 4A is a sectional view taken on line II—II of FIG. 3.
Figure 4B:
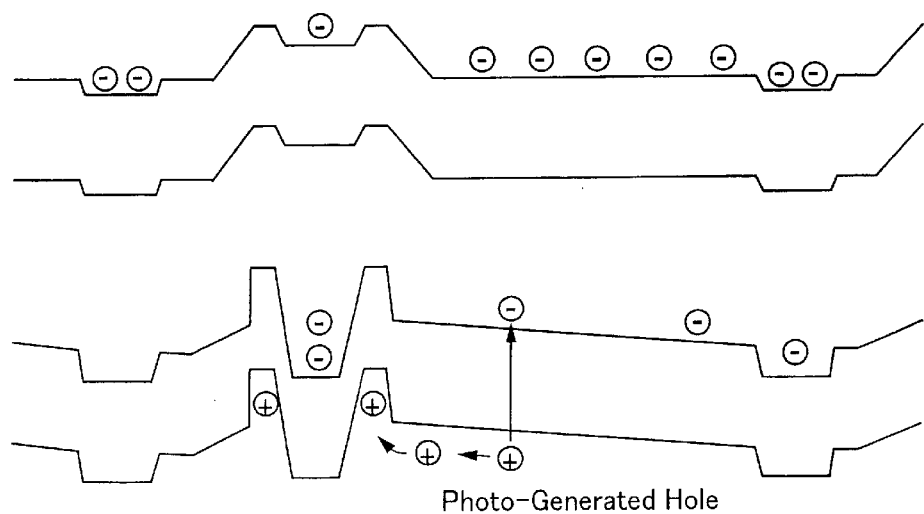
FIG. 4B is views showing a state of a potential, in which photo-generated holes are stored in a carrier pocket, and an electron is induced in a channel region, forming an accumulated region with electrons. The upper view thereof shows a state of a potential taken on line IV—IV of FIG. 4A, and the lower view thereof shows a state of a potential taken on line V—V of FIG. 4A.
Figure 4C:
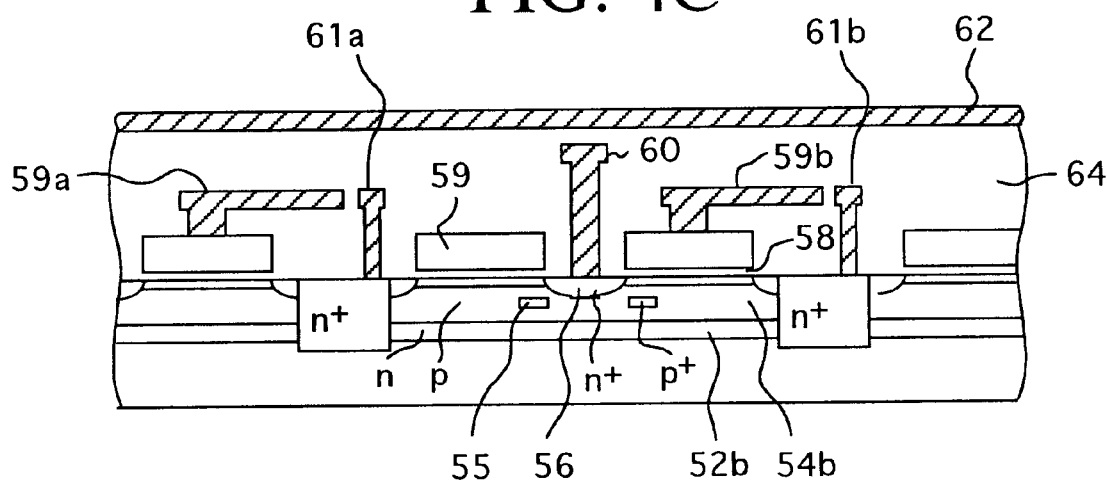
FIG. 4C is a sectional view taken on line III—III of FIG. 3.

FIG. 4A is a sectional view taken on line II—II of FIG. 3, showing the device structure of the MOS image sensor of the embodiment of the present invention; the upper view of FIG. 4B is a view showing the state of a potential taken along IV—IV line in FIG. 4A; the lower view of FIG. 4B is a view showing the state of a potential taken along V—V line in FIG. 4A; and FIG. 4C is a sectional view taken on line III—III of FIG. 3.

As shown in FIG. 4A, p-tye silicon having impurity concentration of about $1\times10^{15}$ cm$^{-3}$ is epitaxially grown on a substrate 51 made of p-type silicon having impurity concentration of $1\times10^{18}$ cm$^{-3}$ or higher. Then, by selective ion implantation or the like, a thick n-type layer 52a is formed on the photo-diode 111, and a thin n-type layer 52b is formed on the PXMOSFET 112.

In the n-type layers 52a and 52b, a plurality of pixels 101 are provided. The pixel includes the photo-diode 111 and the PXMOSFET 112. The photo-diode 111 and the PXMOSFET 112 are formed in different well regions on the n-type layers 52a and 52b, i.e., in first and second well regions 54a and 54b, and these well regions 54a and 54b are connected to each other. The first well region 54a in the photo-diode 111 constitutes a part of a region for generating charges by light irradiation. The second well region 54b in the PXMOSFET 112 constitutes a gate region capable of changing a channel threshold voltage by a potential applied to the region 54b.

N-type impurities are introduced into the surface layer of the second well region 54b below the gate electrode 59, forming a channel region 54c. The impurity region 57 and the drain region 57a are integrally formed such that most of the region can be located in the surface layer of the connected first and second well regions 54a and 54b.

Then, an n-type diffusing isolation region (pixel isolation region) 53 is formed in such a way as to isolate each pixel 101.

As shown in FIGS. 4A and 4C, the diffusing isolation region 53 has a conductivity type same as the impurity region 57, the drain region 57a and the n-type layer 52a, 52b. It is formed deeper than the well region 54a, 54b to connect with the impurity region 57, the drain region 57a and the n-type layer 52a, 52b.

As shown in the lower view of FIG. 4B, the diffusing isolation region 53 forms a potential barrier to holes (photo-generated charges) between the adjacent well region 54a, 54b to prevent holes from mutually moving about between the adjacent well region 54a, 54b. On the other hand, the diffusing isolation region 53 does not serve as a potential barrier to electrons, and thus electrons can move about between the drain regions 57a of adjacent pixels 101. In this manner, the diffusing isolation region 53 can isolate adjacent pixels 101 from each other. Holes generated in the well region 54a, 54b are collected in the hole pocket 55 and corresponding electrons flow out to the drain region 57a.

Next, the photo-diode 111 will be described in detail by referring to FIGS. 4A.

The photo-diode 111 includes: the n-type layer 52a; the p-type first well region 54a formed in the surface layer of the n-type layer 52a; and the n-type impurity region 57 extended from the surface layer of the first well region 54a to the surface layer of the n-type layer 52a. The n-type layer 52a below the first well region 54a is formed thick so as to effectively respond even to a light having a long wavelength to generate photo-generated charges.

The impurity region 57 is extended from the drain region 57a of the PXMOSFET 112, and formed integrally with the drain region 57a.

In a storing period described below, the impurity region 57 is connected to the drain voltage supply lines 61a, 61b, . . . , and biased to a positive potential. In this case, a depletion layer is spread to the n-type layer 52a from a boundary surface between the substrate 51 and the n-type layer 52a, reaching the first well region 54a. On the other hand, a depletion layer is spread to the entire first well region 54a, reaching the n-type layer 52a from a boundary surface between the impurity region 57 and the first well region 54a.

Since the first well region 54a are connected to the gate region 54b of the PXMOSFET 112, photo-generated holes can be collected and thus effectively used as charges for threshold voltage modulation of the PXMOSFET 112. In other words, the first well region 54a become a carrier generation region by light.

In the photo-diode 111, the carrier generation region by light is arranged below the impurity region 57. It means that the photo-diode 111 has a buried layer structure for the photo-generated holes. Therefore, it is possible to reduce noise through being not affected by the semiconductor surface of a high capture level.

Next, the PXMOSFET 112 will be described in detail by referring to FIG. 4A and FIG. 4C.

The PXMOSFET 112 includes, in order from the bottom layer, the p-type substrate 51, the n-type layer 52b on the substrate 51, and the p-type second well region 54b formed in the n-type layer 52b. The n-type layer 52b is made thin in order to effectively apply electric field to the second well region 54b thereon during initialization described below.

The PXMOSFET 112 includes the source region 56, the drain region 57a and the gate electrode 59. The source electrodes (vertical output lines) 60a, 60b, . . . , are connected to the source region 56, and the VDD supply lines 61a, 61b, . . . are connected to the drain region 57a via the diffusing isolation region 53. In addition, the VSCAN supply lines 59a and 59b are connected to the gate electrode 59.

The gate electrode 59 is formed on the second well region 54b between the drain region 57a and the source region 56 by interpolating the gate insulating film 58. The surface layer of the second well region 54b below the gate electrode 59 becomes a channel region. Further, in order to maintain the channel region in an accumulated state with electrons or a depletion state at a normal operation voltage, a channel doped layer 54c is formed by introducing n-type impurities of proper concentration into the channel region.

In the well region 54b below the channel region 54c located below the gate electrode 59, and near the source region 56, a belt-like p+-type carrier pocket (heavily doped buried layer) 55 is formed in a partial region of the channel length direction, and in the entire region of the channel width direction. This p+-type carrier pocket 55 can be formed by, for example, ion implantation. The carrier pocket 55 is formed in the second well region 54b below the channel region 54c formed in the surface layer. The carrier pocket 55 should preferably be formed so as not to be in contact with the channel region 54c.

An impurity concentration of the p+-type carrier pocket 55 is higher compared with that of each of the well regions 54a and 54b in the peripheral part of the carrier pocket 55. Accordingly, the potential of the carrier pocket 55 is set lower compared with that of the peripheral part of the carrier pocket 55 with respect to photo-generated holes among photo-generated charges. Therefore, photo-generated holes can be collected in the carrier pocket 55.

In a carrier sweeping period (initialization period) described below, a high voltage is applied to the source region 56, the gate electrode 59 and the drain region 57a, and a carrier remaining in the second well region 54b is swept out to the substrate 51 side by electric field generated by the high voltage. In this case, a high voltage is applied to the channel doped region 54c, and thus a depletion layer is spread to the second well region 54b from the boundary surface between the channel doped layer 54c of the channel region and the second well region 54b. On the other hand, a depletion layer is spread to the n-type layer 52b below the second well region 54b from the boundary surface between the p-type substrate 51 and the n-type layer 52b. Thus, the electric field generated by the voltage applied to the gate electrode 59 mainly affects the second well region 54b, and the n-type layer 52b below the second well region 54b.

In the carrier sweeping period described above, though a high voltage is applied to the source region 56, the gate electrode 59 and the drain region 57a, a high voltage may be applied to the gate electrode 59 via a gate capacitance and to the drain region 57a via the channel region respectively by applying to the source region 56 a high voltage from a power supply. Or a high voltage may be applied only to the gate electrode from a power supply. Carriers remaining in the well region 54a, 54b can be swept out to the substrate 51 due to these voltage-application methods as well.

FIG. 4B shows a potential state where electrons are induced in the channel region of the source side while photo-generated holes are stored in the carrier pocket 55. Such charge storage causes a change in the threshold voltage of the PXMOSFET 112. Thus, light signal detection can be performed by detecting the change of the threshold voltage.

Figure 23:
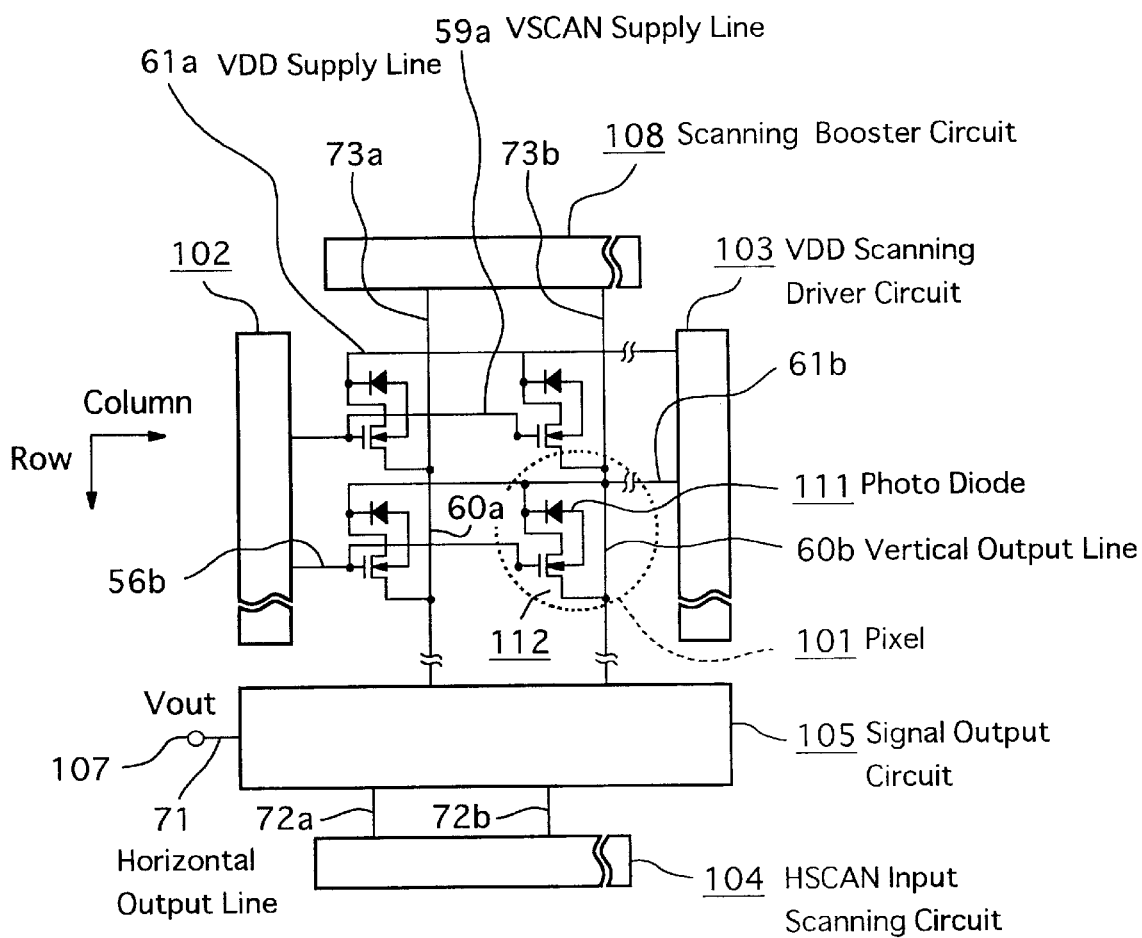
FIG. 23 is a view showing an entire circuitry of the solid-state imaging device of the present invention.

Next, description will be made of the entire constitution of the MOS image sensor using the unit pixel of the foregoing structure by referring to FIG. 23. FIG. 23 shows the circuitry of the MOS image sensor of the embodiment.

As shown in FIG. 23, the MOS image sensor employs the constitution of a two-dimensional array sensor, in which the pixels 101 of the foregoing structure are arrayed in column and row in a matrix form.

A VSCAN scanning driver circuit 102 for a vertical scanning signal (VSCAN) and scanning driver circuit 103 for a drain voltage (VDD) respectively are arranged left and right sandwiching a pixel region.

Each of vertical scanning signal supply lines (VSCAN supply lines) 59a, 59b, . . . is led out with respect to each row from the VSCAN scanning driver circuit 102. Each of the vertical scanning signal supply lines 59a, 59b, . . . is connected to the gate electrodes 59 of PXMOSFETs 112 in all the pixels 101 belonging to the same row.

Each of drain voltage supply lines (VDD supply line) 61a, 61b, . . . , is led out with respect to each row from the VDD scanning driver circuit 103. Each of the drain voltage supply lines 61a, 61b, . . . is connected to the drain regions 57a of the PXMOSFETs 112 in all the pixels 101 belonging to the same row.

Each of vertical output lines 60a, 60b, . . . is led out with respect to each column, and is connected to the source electrodes 56 of the PXMOSFETs 112 in all the pixels 101 belonging to the same column.

Further, the source region 56 of each PXMOSFET 112 is connected through each of the vertical output lines 60a, 60b, . . . to a signal output circuit 105 for each column. Then, the source region 56 is directly connected to a line memory composed of a capacitor, not shown, in the signal output circuit 105.

The PXMOSFETs 112 of the pixels 101 are sequentially driven based on a vertical scanning signal (VSCAN) and a horizontal scanning signal (HSCAN). Accordingly, a video signal (Vout), which contains no noise components caused by residual charges and thus is in proportion to a light incident quantity, is read out from the signal output circuit 105.

Besides, a scanning booster circuit 108 as shown in FIG. 23 may be connected to the source regions 56 of PXMOS-FETs 112 in all the pixels 101 arranged in the same column. Timing chart in this case is shown FIG. 25, and the driving method is described afterwards.

Figure 24:
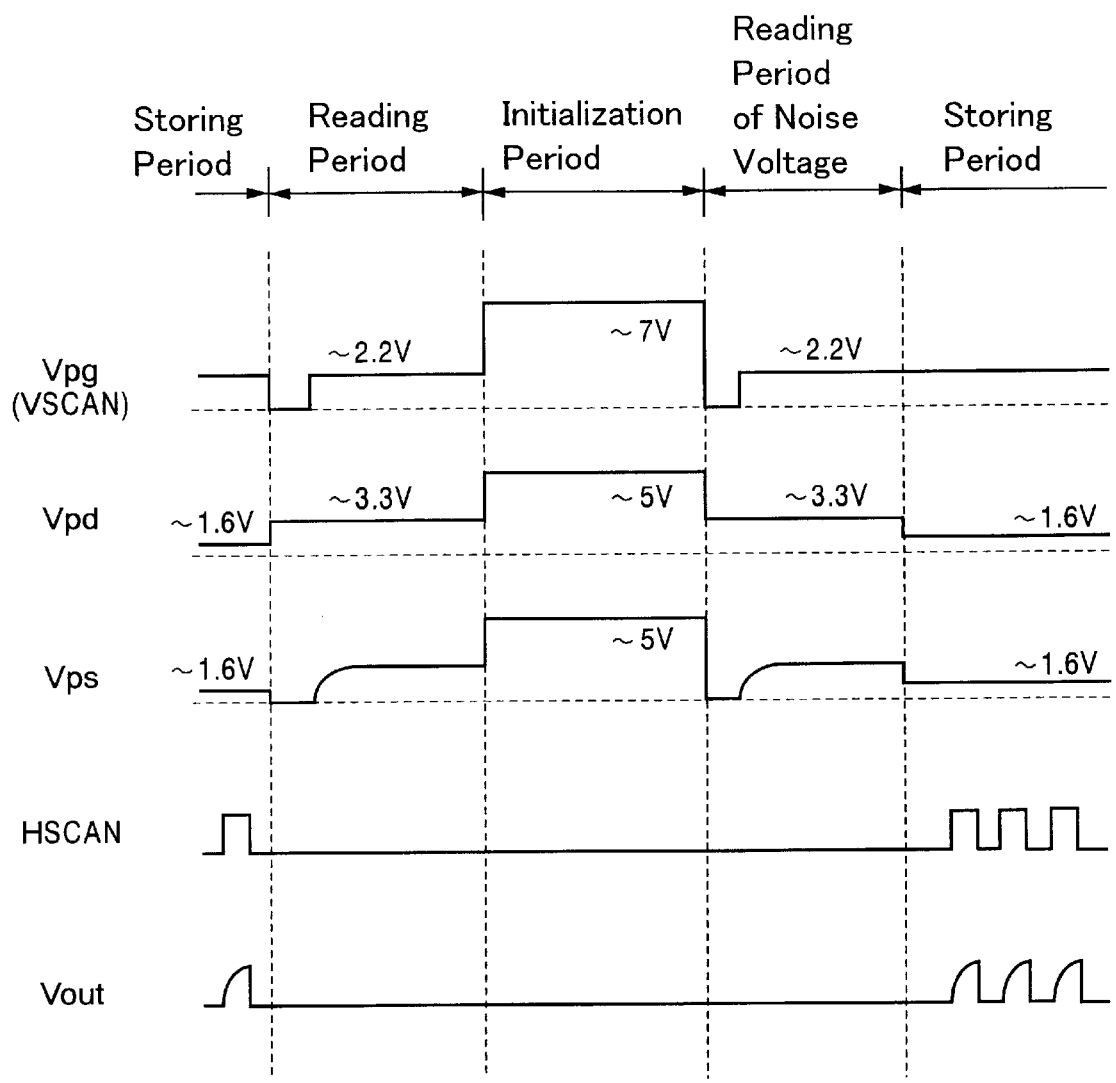
FIG. 24 is a timing chart showing a driving method for the solid-state imaging device of the embodiment of the present invention.

Next, description will be made of a device operation carried out to detect a light signal in the MOS image sensor by referring to FIG. 24. FIG. 24 is a timing chart showing a device operation for light signal detection.

In the device operation for light signal detection in the MOS image sensor, a series of steps, i.e., charge storing period-reading period-initialization period (sweeping period), is repeated, for example in the manner of charge storing period-reading period-initialization period (sweeping period)-charge storing period, . . . . In the embodiment, a reading period of noise voltage is provided between the initialization period and the charge storing period.

In the charge storing period shown in FIG. 24, carriers are generated by light irradiation, and holes among the photo-generated carriers are moved in the first and second well regions 54a and 54b, and stored in the carrier pocket 55. In this case, a positive voltage of about +1.6 V is applied to the drain region 57a, and the source region 56 is cut off from the external circuit. A positive voltage of about +2 to 3 V is applied to the gate electrode 59 such that the sufficient amount of electrons can be induced in the channel region of the PXMOSFET 112. Consequently, through the channel region, a positive voltage of about +1.6 V similar to that of the drain region 57a is also applied to the source region 56. This charge storing period is also a period for outputting a voltage of a difference between a first source potential modulated by a light signal stored in the first memory, and a second source potential stored in the second memory after initialization.

In the reading period for reading a signal voltage, a change in the threshold voltage of the PXMOSFET 112 by photo-generated charges stored in the carrier pocket 55 is read as a change in a source potential, and stored in the first line memory. A positive voltage of about +3 V is applied to the drain region 57a, and a positive voltage of about +2 to 3 V is applied to the gate electrode 59.

In the initialization period, before storing photo-generated charges (photo-generated carrier), acceptors, donors or the like are neutralized, alternatively holes, electrons captured at the surface level or the like, photo-generated charges remaining after reading, i.e., residual charges are discharged from the semiconductor, and the carrier pocket 55 is emptied. A high positive voltage of about +5 V is applied to the drain region 57a, the gate electrode 59 and the source region 56.

In the noise voltage reading period for reading a noise voltage, the second line memory stores the second source potential under the state such that photo-generated charges are being swept out from the carrier pocket 55. Also in this period, a voltage similar to that in the reading period for reading a signal voltage is applied to the photo-diode 111 and the PXMOSFET 112.

In each period described above, the voltage applied to each electrode is not limited to that described above, and it may be suitably changed to perform the operation required in each period.

Figure 25:
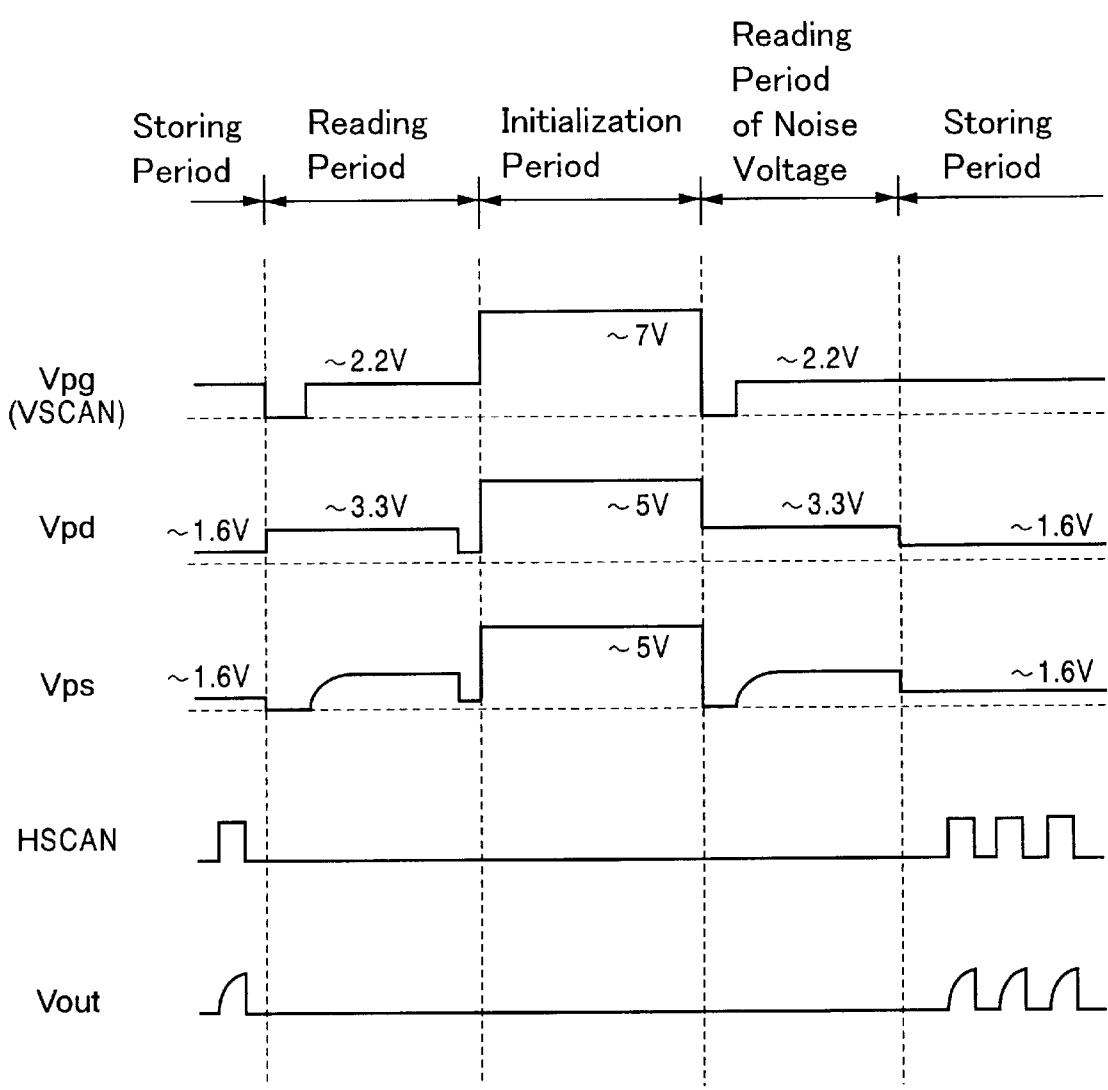
FIG. 25 is a timing chart showing another driving method for the solid-state imaging device of the embodiment of the present invention.

Moreover, in the initialization period, though the high voltages for initialization are applied to the source region 56, the gate electrode 59 and the drain region 57a respectively from power supplies, the high voltage for initialization may be applied to the source region 56 from the power supply, while the high voltage may be applied to the gate electrode 59 via the gate capacitance and to the drain region 57a via the channel region accumulated with electrons. In this case, before moving to the initialization period from the reading period for reading a signal voltage, as shown in FIG. 25, a source potential is reduced to a low potential while a gate potential is being maintained and the drain region 57a is set to floating. Accordingly, electrons are induced in the channel region and accumulated, interconnecting the drain region 57a and the source region 56 through the channel region so that the drain region is set to the low potential. Thus, in the next initialization period, the high voltage is applied to the source region 56 from the power supply while the gate electrode 59 is set to floating. Consequently, the gate potential is increased to be higher than the source potential by the voltage keeping charged in the gate capacitance prior to the initialization period, and the drain potential is increased to be equal to the source potential.

Figure 26:
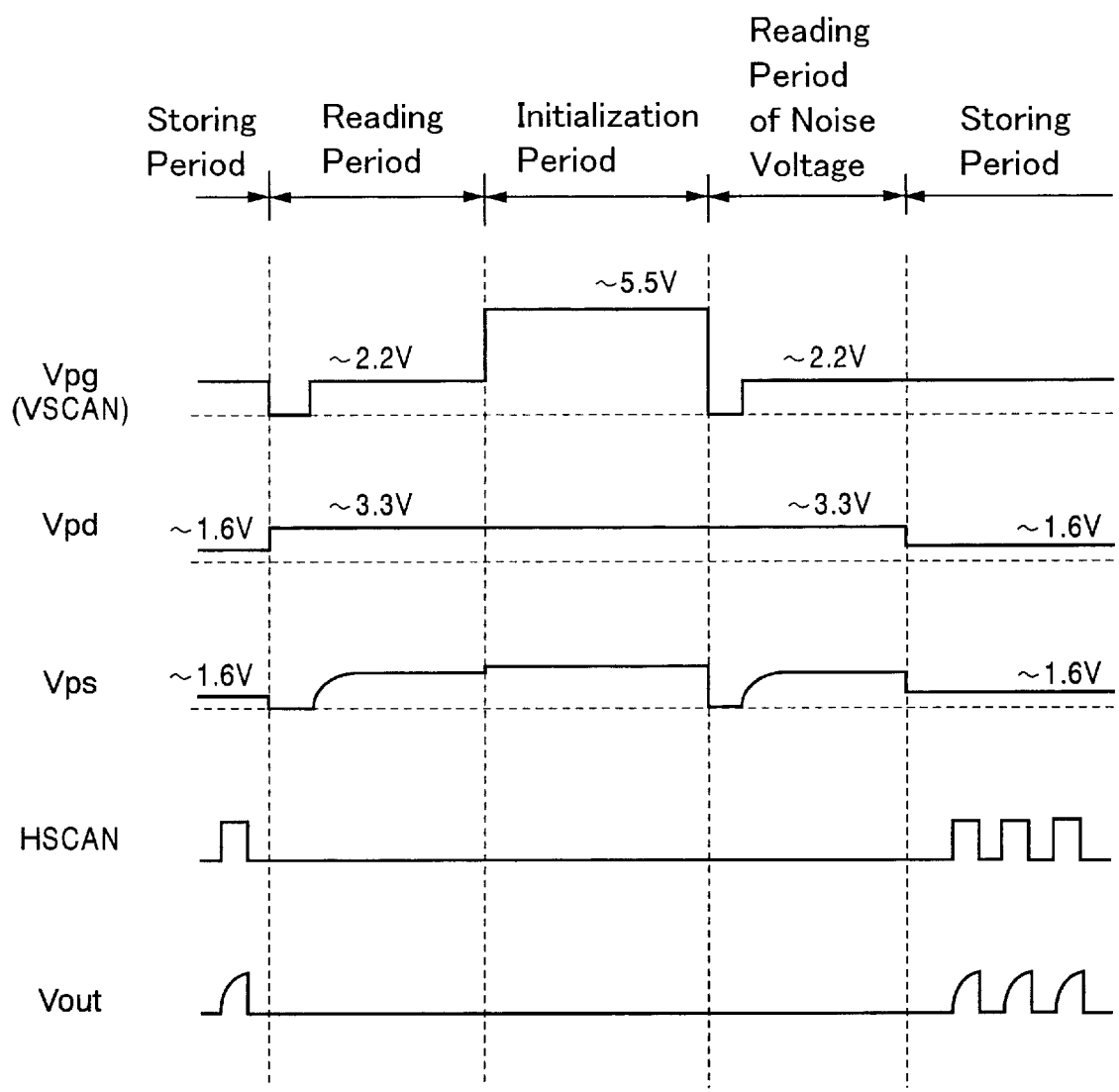
FIG. 26 is a timing chart showing yet another driving method for the solid-state imaging device of the embodiment of the present invention.

Further, in another voltage applied method for initialization, as shown in FIG. 26, a high voltage for initialization may be applied only to the gate electrode 59 from a power supply. In other words, the process moves to the initialization period while the potential of the reading period is being maintained as it is and, in the initialization period, a voltage for initialization is applied only to the gate electrode 59. No particular voltage for initialization needs to be applied to the source region 56 and the drain region 57a.

Figure 5:
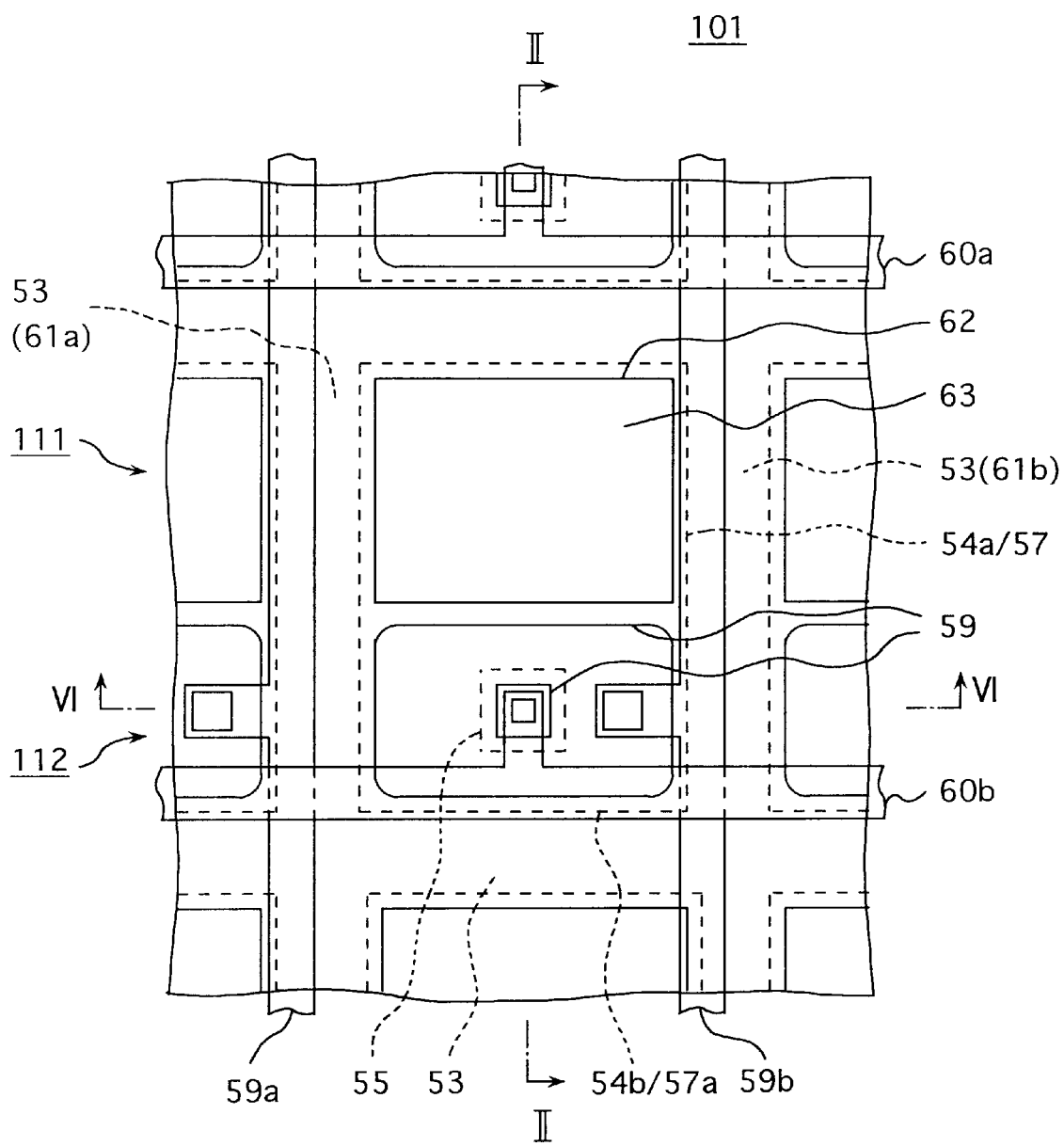
FIG. 5 is a plan view showing an element layout in a pixel of another solid-state imaging device of the first embodiment.
Figure 6:
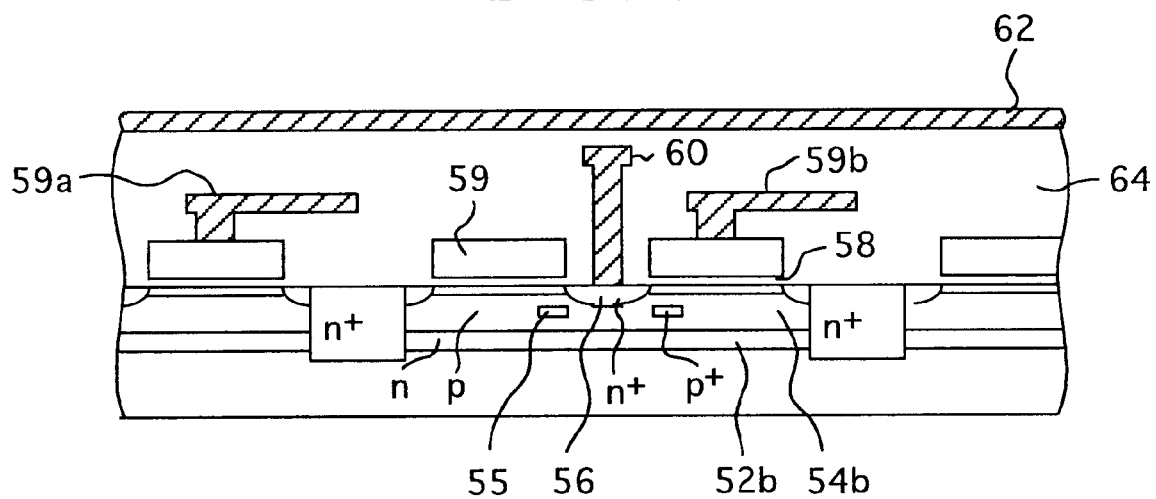
FIG. 6 is a sectional view taken on line IV—IV of FIG. 6.

Next, another constitution different from those shown from FIGS. 3, 4A, 4C will be described. FIG. 5 is a plan view showing another structure different from that shown in FIG. 3; and FIG. 6 is a sectional view taken on line VI—VI of FIG. 5. Compared with the structure of FIG. 3, this constitution is characterized in that a metal wiring is not provided as the VDD supply lines 61a, 61b, . . . but the diffusing isolation region 53 connected to the drain region 57a serves as the VDD supply lines 61a, 61b, . . . .

On the other hand, the following features are same as those shown in FIG. 3. That is, a periphery around the pixel 101 is surrounded leaving no pitch by the diffusing isolation region 53 connected to the drain region 57a, and an isolation between adjacent pixels 101 is performed only by the diffusing isolation region 53 without employing any insulating films by the LOCOS method.

In FIGS. 5 and 6, components denoted by reference numerals similar to those shown in FIGS. 3, 4A and 4C are same as components shown in FIGS. 3, 4A and 4C, and thus description thereof will be omitted.

As described above, according to the first embodiment of the present invention, since the adjacent pixels 101 are isolated from each other only by the diffusing isolation region 53 without using any insulating films by the LOCOS method, the pixels 101 can be microfabricated without forming any extra regions such as bird's beak.

(Second Embodiment)

Each of FIGS. 7 to 10 is a schematic view showing a pixel layout according to the second embodiment. In the drawings, a mark □ indicates the arrangement of a light-detecting portion; and a mark ○ indicates the arrangement of the gate electrode of a PXMOSFET.

Figure 7:
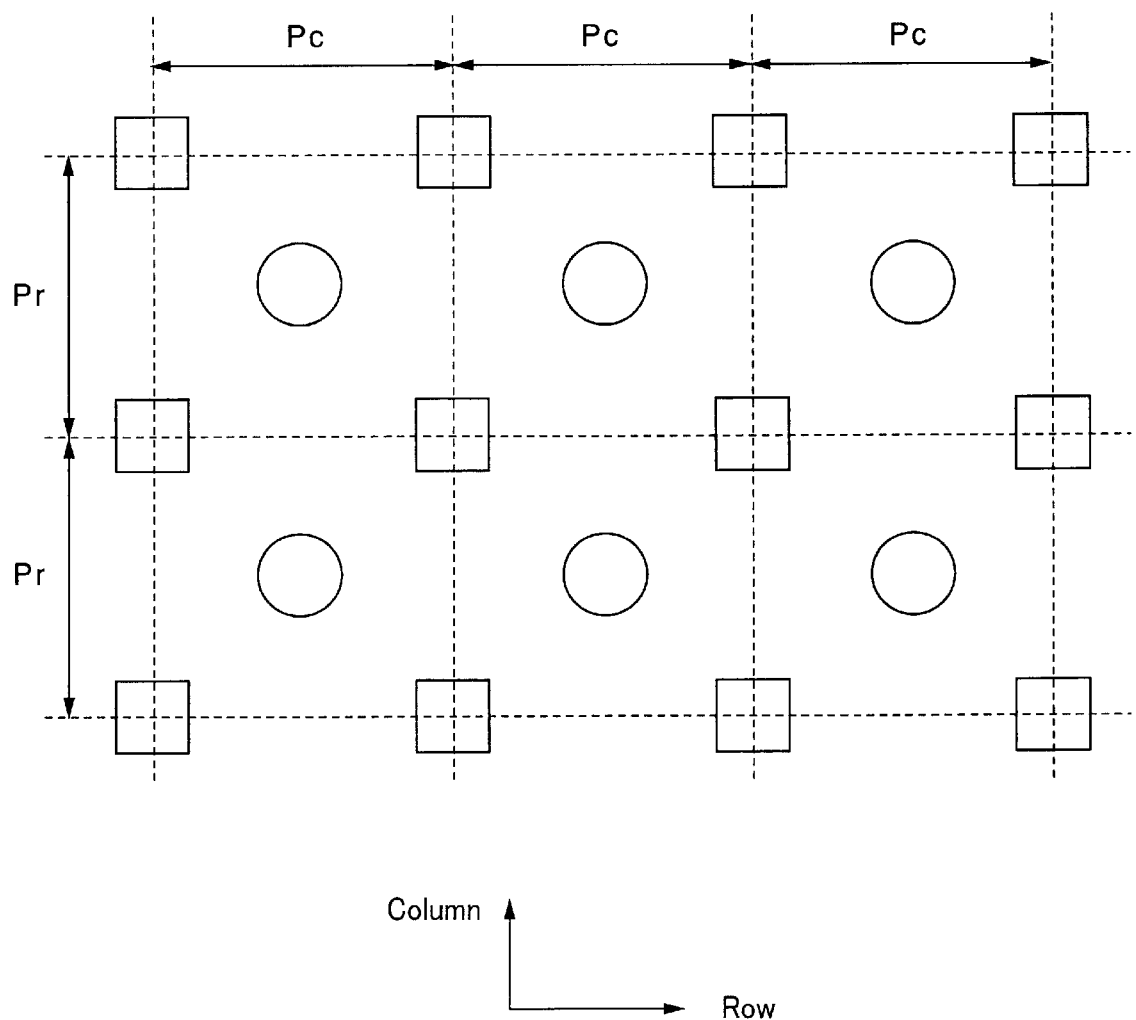
FIG. 7 is a plan view showing an element layout in a pixel of a solid-state imaging device according to a second embodiment of the present invention.

FIG. 7 is an example showing the arrangement of light-detecting portions which is regular without pitch shift between adjacent rows and adjacent columns. It is possible to arrange components in the pixel such that a direction from the gate electrode to the photo diode can coincide with an oblique direction with respect to the row and column directions. In addition, the light-detecting portions are arranged with a pitch Pc on the row-directed line, and with a pitch Pr on the column-directed line.

As shown in FIG. 7, the photo-diode 111 is disposed among so-called lattices composed of row-directed lines of the gate electrode 59 and column-directed lines of the same. Accordingly, it is possible to reduce a row pitch, column pitch or both pitches while the forming area of a light-detecting portion having so-called isotropic expansion and the forming area of the gate electrode 59 are secured.

Figure 8:
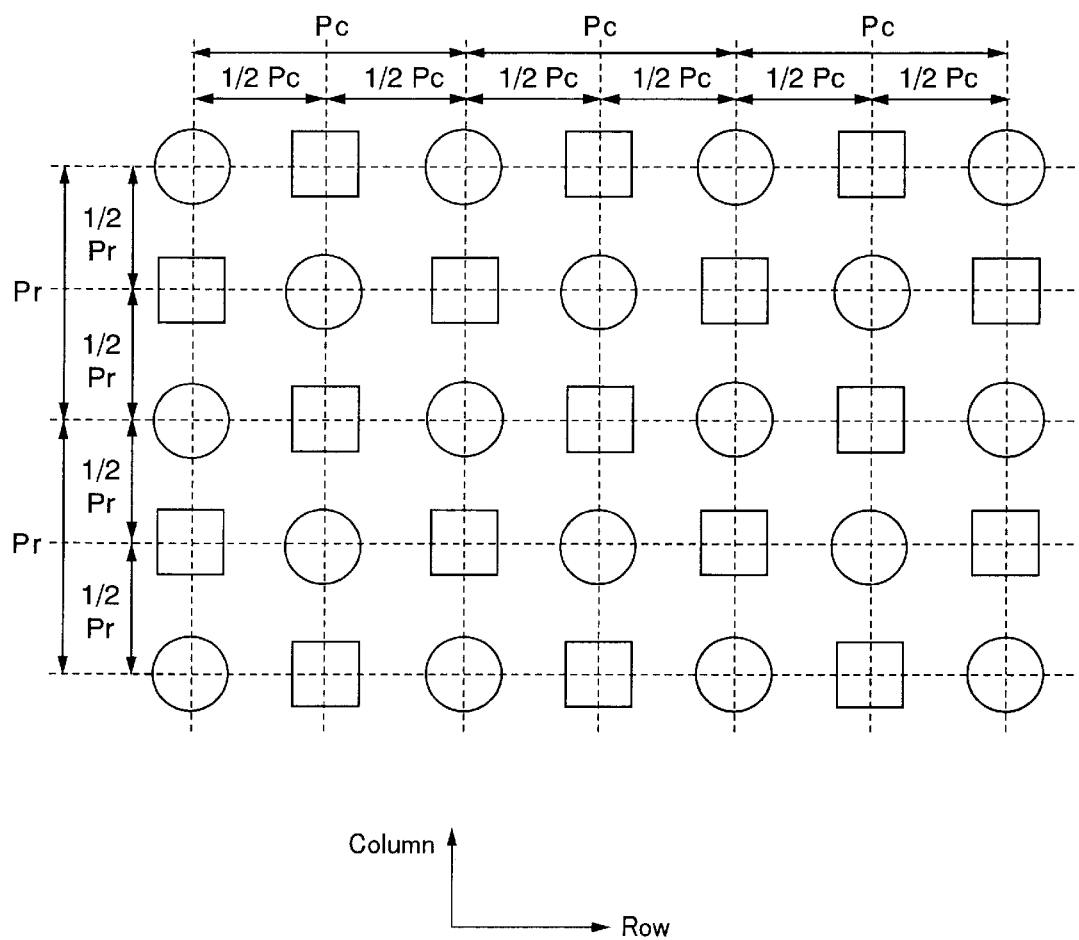
FIG. 8 is a plan view showing another element layout in the pixel of the solid-state imaging device of the second embodiment.

FIG. 8 is an example showing the arrangement of light-detecting portions in which adjacent row-directed lines are arranged such that the lines are shifted from each other by 1/2Pc on the row direction, and adjacent column-directed lines are arranged such that the lines are shifted from each other by 1/2Pr on the column direction. The light-detecting portions on one row-directed line are arranged with a pitch Pc and the arrangement of the light-detecting portions on one column-directed line has a pitch Pr.

It is possible to arrange the components inside the pixel such that a direction from the gate electrode to the photo-diode can coincide with a parallel direction with respect to the row or column direction, and to arrange adjacent pixels such that the directions from the gate electrode to the photo-diode turn to the same directions. Alternatively, It is possible to arrange adjacent pixels such that the directions from the gate electrode to the photo-diode turn to the opposite directions to each other.

In other words, the gate electrode and the photo diode are alternately arranged on the row-directed line and the column-directed line. Accordingly, at the time of reducing a row pitch, a column pitch or both pitches, it is possible to secure a forming area of the light detecting portion having so-called isotropic expansion and the forming area of the gate electrode being sufficiently wide.

Further, the gate electrodes belonging to the light detecting portions on adjacent two row-directed lines are sequentially connected to form the one row line. The arrangement of the light detecting portions in the same row shapes in a zigzag manner along the row direction. This zigzag arrangement results in a same advantage as so-called pixel shifting in the solid-state imaging device of the three-plate system using a CCD device. In other words, a pitch between adjacent row lines substantially becomes narrower than the row pitch Pr compared with no pixel shifting, so that a light signal irradiated between the rows with pitch Pr is captured as well. Accordingly, resolution can be enhanced in the single-plate system.

Figure 9:
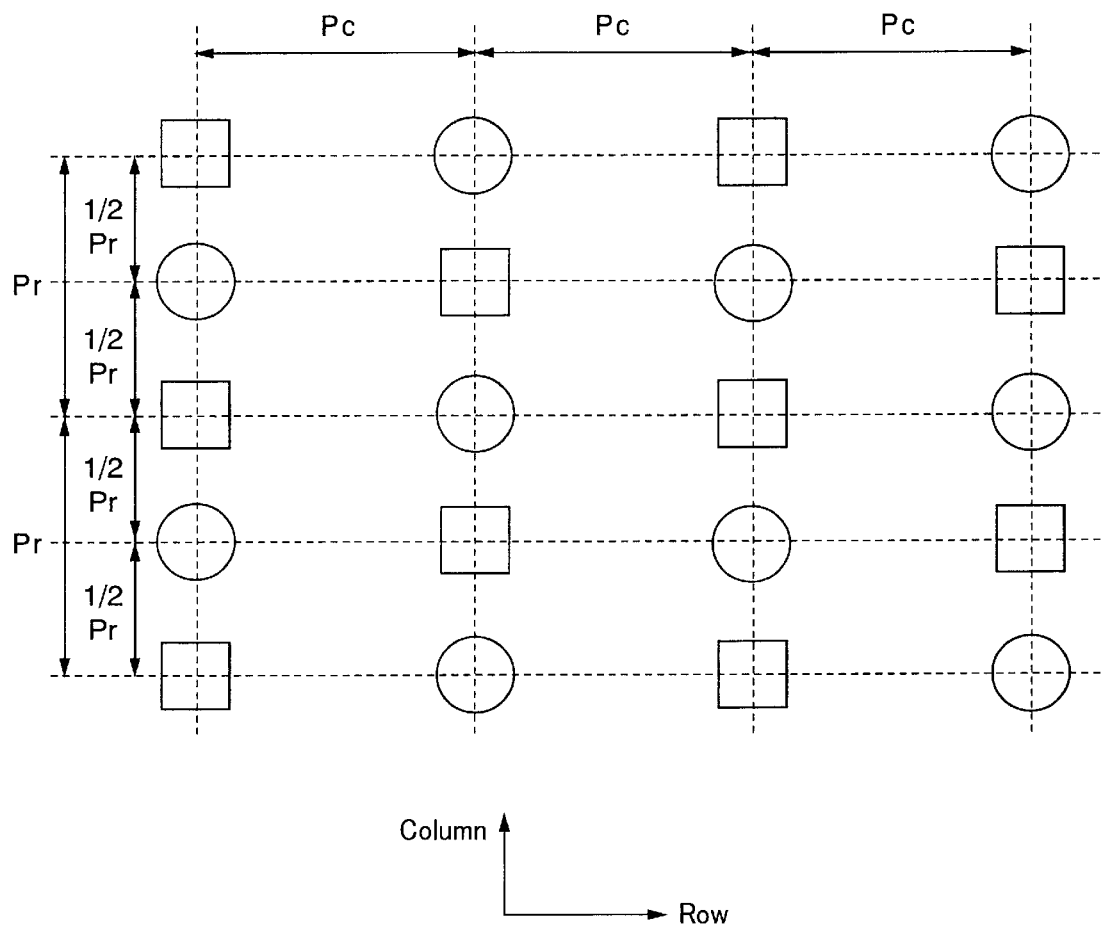
FIG. 9 is a plan view showing another element layout in the pixel of the solid-state imaging device of the second embodiment.

FIG. 9 is an example showing the arrangement of light-detecting portions in which adjacent column-directed lines are shifted from each other with 1/2Pr along the column direction with regard to the regular arrangement in which the photo diodes are put at intersecting points among row-directed lines extending to the row direction at regular pitches (row pitch Pr) and column-directed lines extending to the column direction at regular pitches (column pitch Pc). In other word, the pitch of the photo-diodes on the column-directed line is not changed to be pitch Pr while the pitch of the photo-diodes on the row-directed line is wider than that in the regular arrangement to be pitch 2×Pc. In addition, a pitch between adjacent row-directed lines of light detecting portions is 1/2Pr. Since a pitch of the photo diodes on the row-directed line is wider, it is possible to widen the width of the gate electrode on the row direction. It is suited for increasing an amount of charges stored in the hole pocket.

It is possible to arrange the components inside the pixel such that a direction from the gate electrode to the photo-diode can coincide with a parallel direction with respect to the row or column direction, and to arrange adjacent pixels such that the directions from the gate electrode to the photo-diode turn to the same directions each other. Alternatively, It is possible to arrange adjacent pixels such that the directions from the gate electrode to the photo-diode turn to the opposite directions to each other.

In other words, the gate electrode and the photo diode are alternately arranged on the row-directed line and the column-directed line. Accordingly, at the time of reducing a row pitch, it is possible to secure a forming area of the light detecting portion having so-called isotropic expansion and the forming area of the gate electrode being sufficiently wide.

Further, when adjacent two row-directed lines are integrated into one row similar to the case in FIG. 8, the arrangement of the light detecting portions in the same row line shapes in a zigzag manner along the row direction. This zigzag arrangement results in a same advantage as so-called pixel shifting in the solid-state imaging device of the three-plate system using a CCD device. In other words, a pitch between adjacent row lines substantially becomes narrower than the row pitch Pr compared with the regular arrangement, so that a light signal irradiated between the rows with pitch Pr is captured as well. Accordingly, resolution can be enhanced in the single-plate system.

Figure 10:
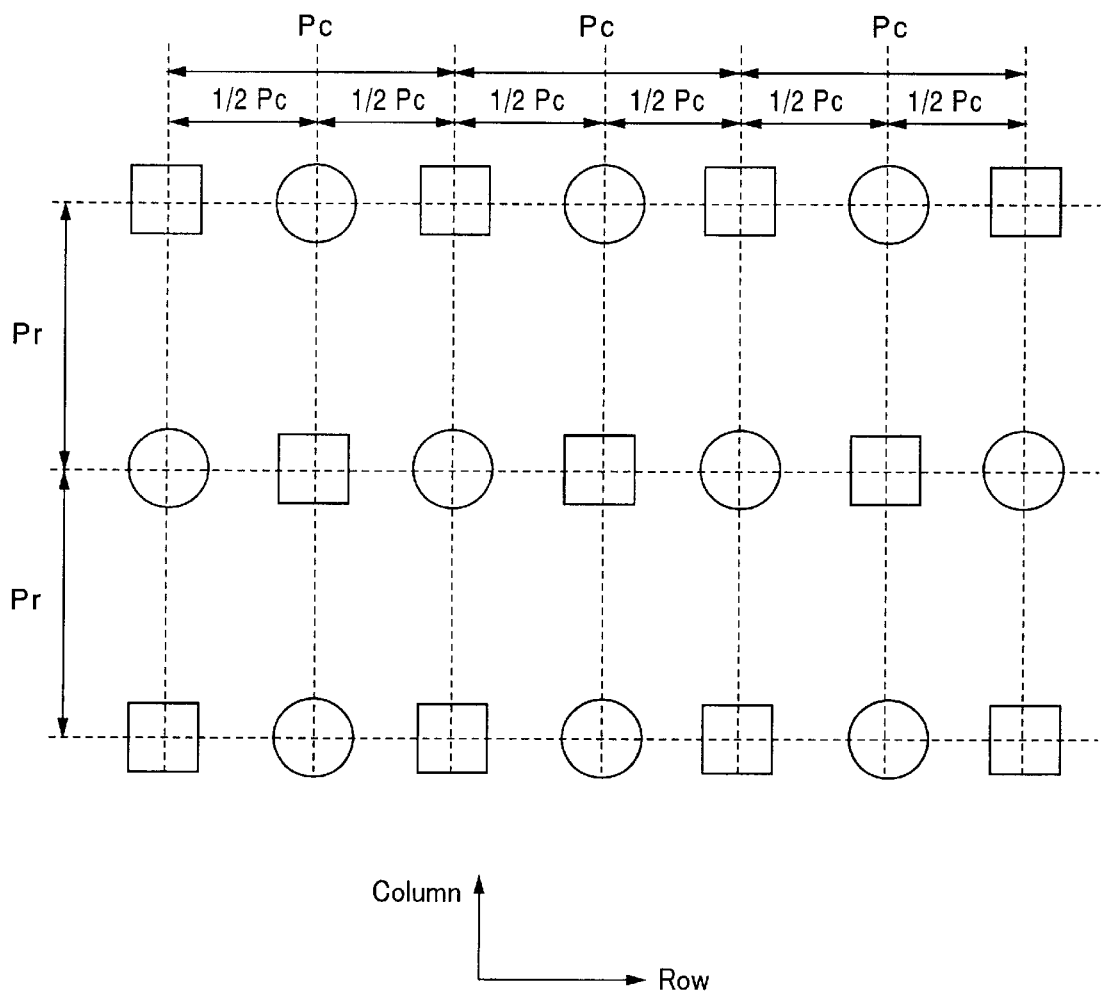
FIG. 10 is a plan view showing yet another element layout in the pixel of the solid-state imaging device of the second embodiment.

FIG. 10 is an example showing the arrangement of light-detecting portions in which adjacent row-directed lines are shifted from each other with 1/2 Pc along the row direction with regard to the regular arrangement. In other word, the pitch of the photo-diodes on the row-directed line is not changed to be pitch Pr while the pitch of the photo-diodes on the column-directed line is wider than that in the regular arrangement to be pitch 2×Pc. In addition, a pitch between adjacent column-directed lines of light detecting portions is 1/2 Pc. Since an pitch of the photo diodes on the column-directed line is wider, it is possible to widen the width of the gate electrode on the column direction. It is suited for increasing an amount of charges stored in the hole pocket. Further, it is suited for forming an insulating isolation region between the rows in order to isolate pixels each row.

It is possible to arrange the components inside the pixel such that a direction from the gate electrode to the photo-diode can coincide with a parallel direction with respect to the row or column direction, and to arrange adjacent pixels such that the directions from the gate electrode to the photo-diode turn to the same directions. Alternatively, It is possible to arrange adjacent pixels such that the directions from the gate electrode to the photo-diode turn to the opposite directions to each other.

In other words, the gate electrode and the photo diode are alternately arranged on the row-directed line and the column-directed line. Accordingly, at the time of reducing a column pitch, it is possible to secure a forming area of the light detecting portion having so-called isotropic expansion and the forming area of the gate electrode being sufficiently wide.

(Third Embodiment)

Figure 11:
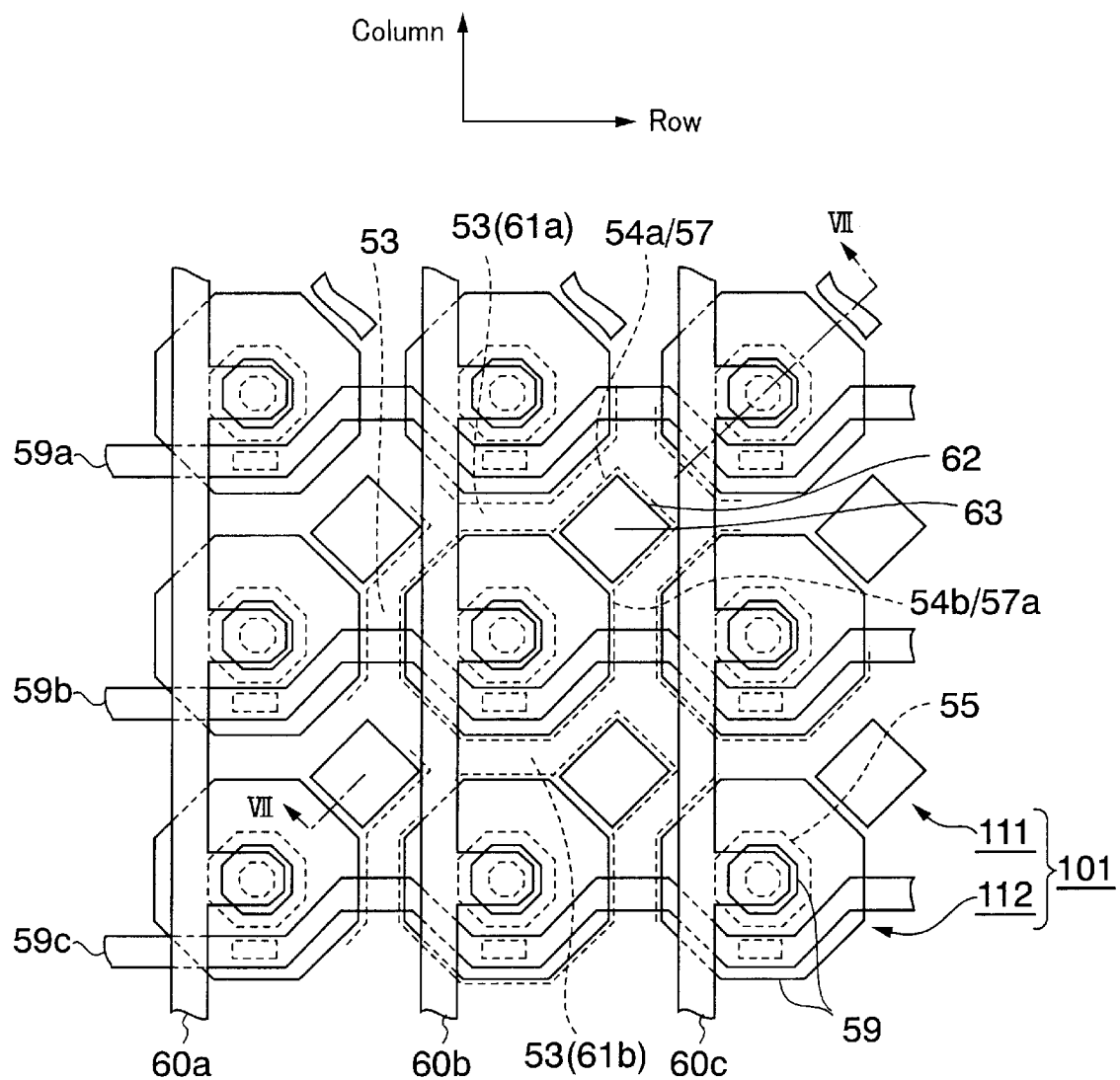
FIG. 11 is a plan view showing an element layout in a pixel of a solid-state imaging device according to a third embodiment of the present invention.

FIG. 11 is a plan view showing the layout of the pixel constituting a MOS image sensor according to the third embodiment of the invention. The arrangement corresponds to that in FIG. 7 of the second embodiment.

As shown in FIG. 11, pixels 101 are arrayed in a matrix form. Each pixel 101 includes a photo-diode 111, and a PXMOSFET 112 provided adjacently to the photo-diode 101. For the PXMOSFET 112, an n channel MOS (nMOS) is used. The pixel 101 is surrounded for its periphery with a pixel isolation region including a series of a diffusing isolation region 53 without any gaps. In addition, a gate electrode 59 in the PXMOSFET 112 has an octagonal peripheral edge part, and a ring shape.

The gate electrodes 59 of the PXMOSFETs 112 arrayed in a row direction are interconnected through vertical scanning signal (VSCAN) supply lines 59a, 59b, . . . , and the source regions 56 of the PXMOSFETs 112 arrayed in a column direction are interconnected through vertical output lines (or source electrode) 60a, 60b,. . . . The vertical scanning signal (VSCAN) supply lines 59a, 59b, . . . , and the vertical output lines (or source electrode) 60a, 60b, . . . , are extended in directions intersecting each other. The diffusing isolation region 53 connected to a drain region 57a also serves as drain voltage (VDD) supply lines (or drain electrode) 61a, 61b, . . . .

In the diffusing isolation region 53 of a place, on which the VSCAN supply lines 59a, 59b, . . . , pass, a surface layer should preferably be set to high concentration in order to prevent inversion caused by electric field from the VSCAN supply lines 59a, 59b, . . . .

The third embodiment has the following particular features. That is, in the pixel 101, a direction from the gate electrode 59 of the PXMOSFET 112 to the photo-diode 111 is directed in an oblique direction with respect to row and column directions.

The gate electrode 59 of the PXMOSFET 112 in the pixel and the gate electrodes 59 of the PXMOSFETs 112 of three adjacent pixels are disposed at four directions around a periphery of the photo-diode 111. Conversely, the photo-diode 111 in the pixel and the photo-diodes 111 of three adjacent pixels are disposed at four directions around a periphery of the gate electrode 59 of the PXMOSFET 112.

In addition, the gate electrodes 59 of the PXMOSFETs 112 interconnected through the same vertical scanning signal (VSCAN) supply lines 59a, 59b, . . . , are arrayed straight in the row direction. The gate electrodes 59 of the PXMOSFETs 112 having the source regions 56 interconnected through the vertical output lines (or source electrode) 60a, 60b, . . . , are arrayed straight in the column direction.

Figure 13:
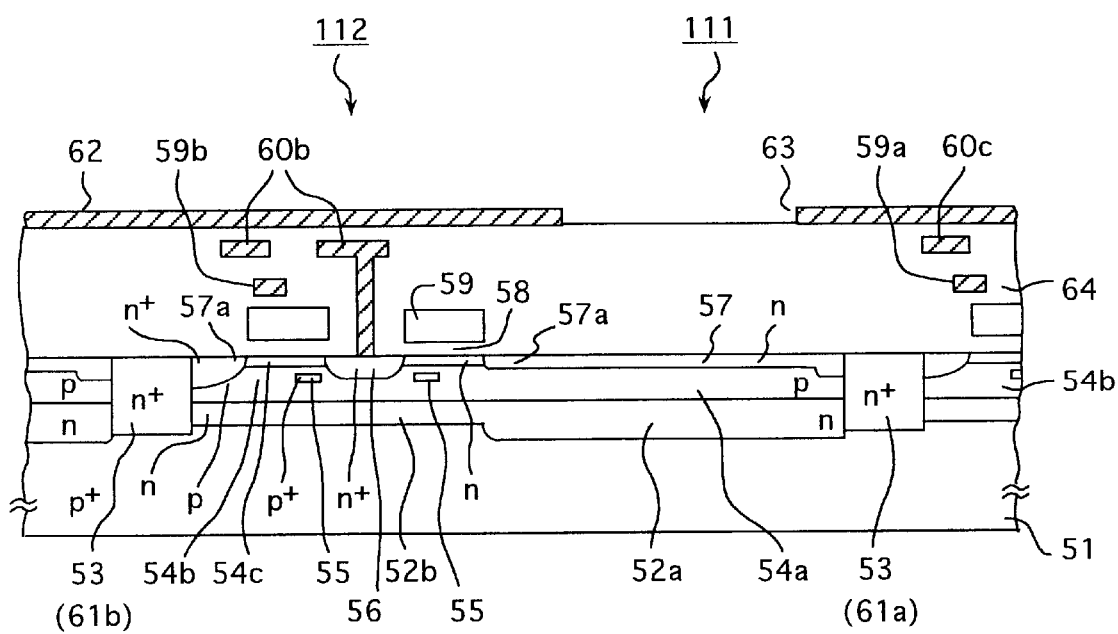
FIG. 13 is a sectional view taken on lines VII—VII of FIG. 11 and VIII—VIII of FIG. 12.

Next, description will be made of the sectional structure of one pixel 101 of the MOS image sensor of the embodiment of the invention by referring to FIG. 13. FIG. 13 is a sectional view taken on line VII—VII of FIG. 11.

As shown in FIG. 13, the photo-diode 111 and the PXMOSFET 112 are respectively formed in different p-type well regions, i.e., first and second well regions 54a and 54b, and these well regions 54a and 54b are connected to each other. The first well region 54a in the photo-diode 111 constitutes a part of a region for generation charges by light irradiation. The second well region 54b in the PXMOSFET 112 constitutes a gate region capable of changing a channel threshold voltage by a potential applied to the region 54b.

An n-type source region 56 is provided inside the inner peripheral edge of a ring shaped gate electrode 59 in the PXMOSFET 112, and an n-type drain region 57a is provided outside the outer peripheral edge of the same gate electrode 59. A region between the source region 56 and the drain region 57a, i.e., the surface layer of the second well region 54b below the gate electrode 59, is set as a channel region. The gate electrode 59 is formed on the channel region 54c by interpolating a gate insulating film 58. At a normal operation voltage, in order to maintain the channel region in an electron accumulated state or in a depletion state, n-type impurities of proper concentration are introduced into the channel region, thereby forming a channel doped layer 54c.

Further, the drain region 57a is extended to form an impurity region 57 of the photo-diode 111. In other words, the impurity region 57 and the drain region 57a are integrally formed such that most of the region 57, 57a can be set in the surface layers of the mutually connected first and second well regions 54a and 54b. In addition, the impurity region 57 and the drain region 57a are extended to the peripheral part of the pixel 101, and brought into contact with the diffusing isolation region 53 surrounding the pixel 101.

Further, a carrier pocket (heavily doped buried layer) 55 as one of the features of the described MOS image sensor is formed so as to surround the source region 56, in a partial region of a channel length direction from the drain region 57a to the source region 56, and in the full region of a channel width direction.

The foregoing components are covered with an insulating film 64 such as a silicon oxide film or the like. A region other than the light detecting window 63 of the photo-diode 111 is shielded from light by a metallic layer (light-shielding film) 62 formed on the insulating film 64.

Figure 12:
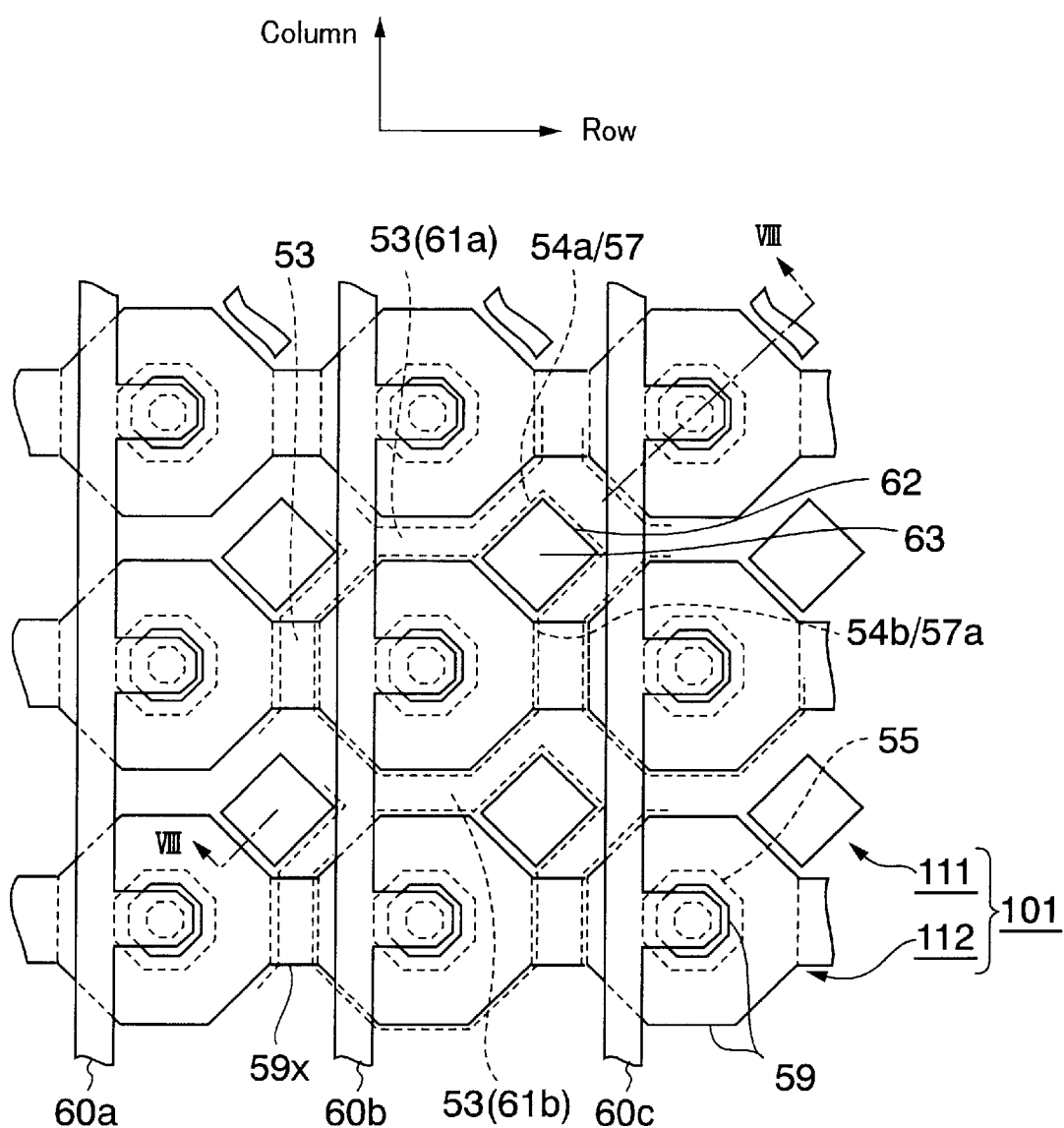
FIG. 12 is a plan view showing an element layout in the pixel of the solid-state imaging device of the third embodiment.

In the foregoing, the gate electrodes 59 of the PXMOS-FETs 112 arrayed in the same row were interconnected through the vertical scanning signal (VSCAN) supply lines 59a, 59b, . . . . However, as shown in FIG. 12, a connection portion 59x may be provided by extending the gate electrode 59, and the gate electrodes 59 of the adjacent PXMOSFETs 112 may be connected to each other. The connection portion 59x is formed by patterning the same material as that of the gate electrode 59 simultaneously when the gate electrode 59 is formed by, for example patterning.

A sectional structure shown in FIG. 13, taken on line VIII—VIII of FIG. 12, is similar to that of FIG. 11. Also in this case, in the diffusing isolation region 53 below the connection portion 59x, the surface layer is preferably set to high concentration in order to prevent inversion caused by electric field from the connection portion 59x.

A circuitry of the MOS image sensor of the embodiment is shown in FIG. 23. The arrangement is similar to that of the first embodiment, and thus description thereof will be omitted.

Further, a timing chart of a device operation for light signal detection in the foregoing MOS image sensor is shown in each of FIGS. 24 to 26. The timing is similar to that of the first embodiment, and thus description thereof will be omitted.

Next, another constitution different from that shown in FIGS. 11 to 13 will be described by referring to FIGS. 14 to 16.

Figure 14:
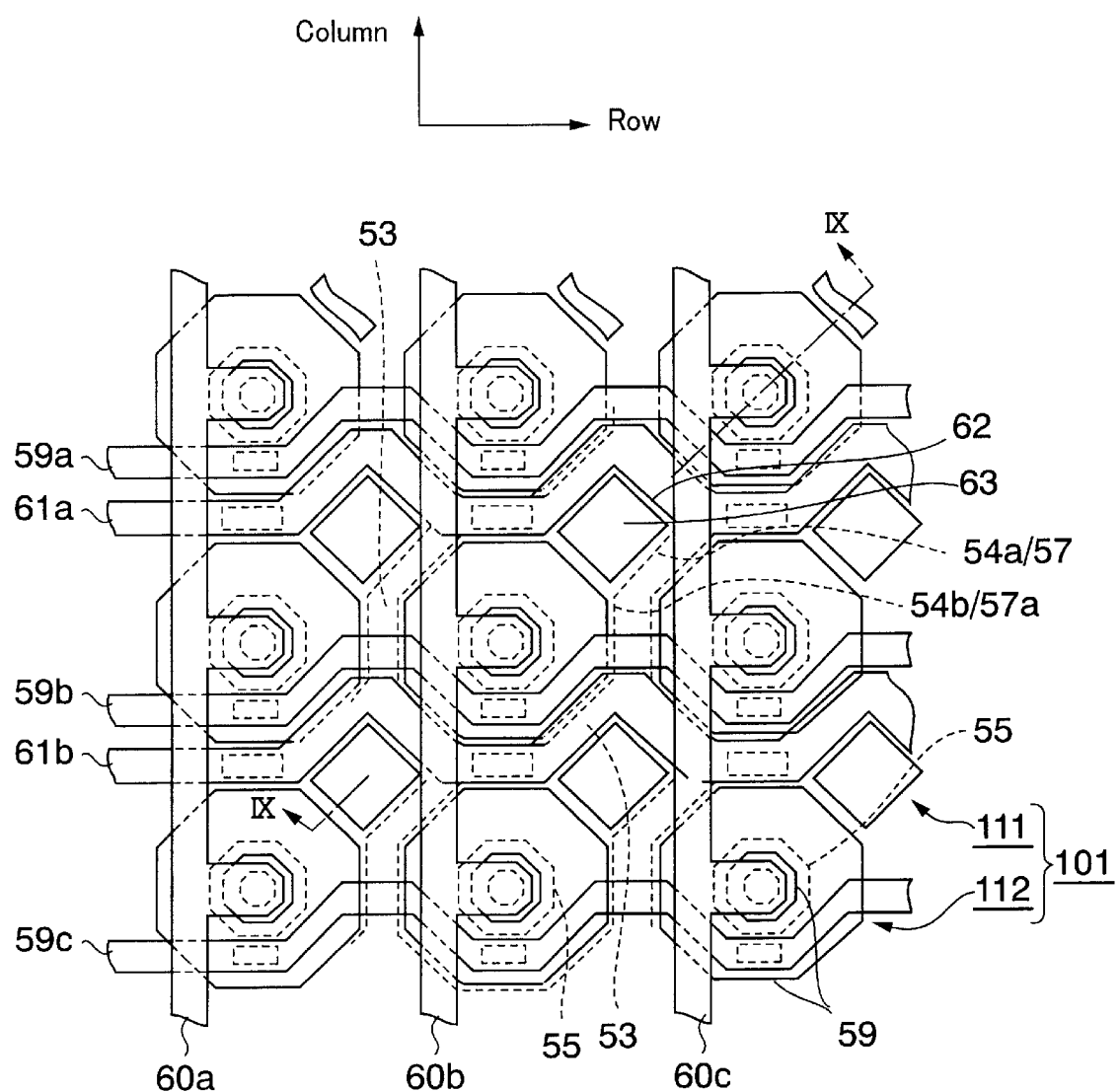
FIG. 14 is a plan view showing an element layout in the pixel of the solid-state imaging device of the third embodiment.
Figure 16:
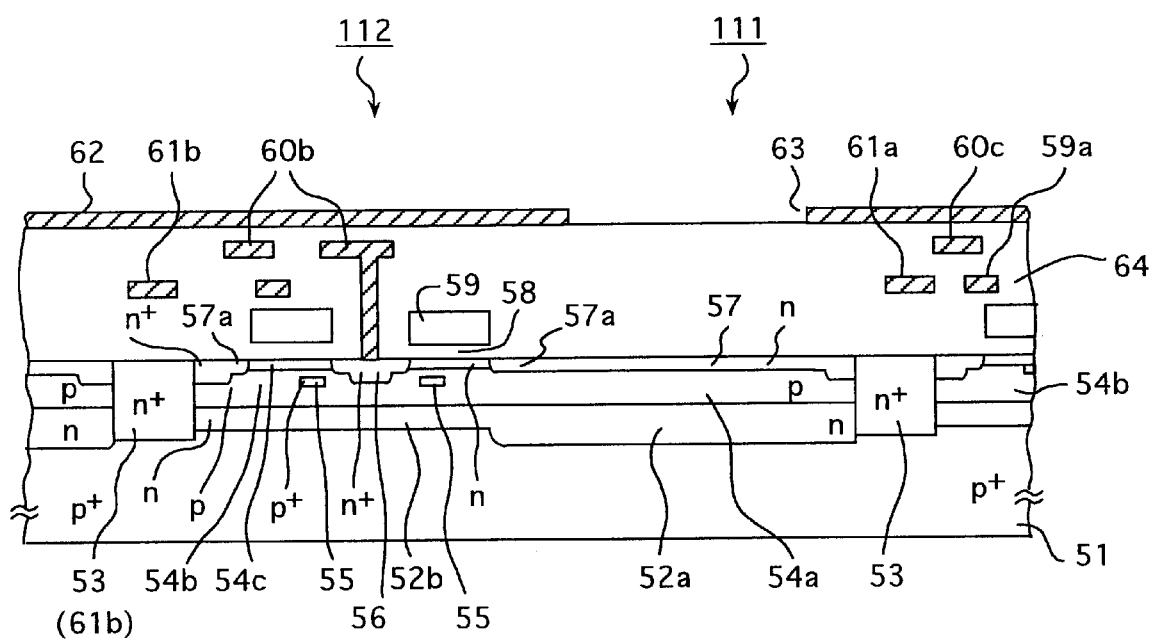
FIG. 16 is a sectional view taken on lines IX—IX of FIG. 145 and X—X of FIG. 15.

FIG. 14 is a plan view showing another structure different from that shown in FIG. 11; and FIG. 16 is a sectional view taken on line IX—IX of FIG. 14.

Different from the structure shown in FIG. 11, VDD supply lines 61a, 61b, . . . , extended in parallel with VSCAN supply lines 59a, 59b, . . . , are newly provided above a drain region 57a, and connected to the drain region 57a of each pixel 101. Portions of FIGS. 14 and 16 denoted by the same reference numerals as those of FIGS. 11 and 13 represent the same components as those of FIGS. 11 and 13.

By employing a structure like that shown in FIGS. 14 and 16, a potential difference in drain voltages among the pixels 101 can be minimized to make uniform the operation of the solid-state imaging device.

In the foregoing, the gate electrodes 59 of the PXMOS-FETs 112 arrayed in the same row were interconnected through the vertical scanning signal (VSCAN) supply lines 59a, 59b, . . . . However, as shown in FIG. 15, a connection portion 59x having an extended gate electrode 59 may be provided to connect the gate electrodes 59 of the adjacent PXMOSFETs 112 to each other. A sectional view taken on line X—X of FIG. 15 is the same as that of FIG. 14, and shown in FIG. 16. Also in this case, in a diffusing isolation region 53 below the connection portion 59x, a surface layer is preferably set to high concentration in order to prevent inversion caused by electric field from the connection portion 59x.

As described above, according to the third embodiment of the present invention, in one pixel 101, the gate electrode 59 having an octagonal planar shape in the peripheral edge is used, the photo-diode 111 is provided adjacently to at least one side of the octagon of the gate electrode 59, and the pixels 101 are arrayed in a matrix form.

In addition, the components in the pixel 101 are arranged such that a direction from the gate electrode 59 to the photo-diode 111 can coincide with an oblique direction with respect to the row and column directions. The gate electrodes 59 of the PXMOSFETs 112 are disposed in four directions around a periphery of the photo-diode 111, and the photo-diodes 111 are disposed in four directions around a periphery of the gate electrode 59 of the PXMOSFET 112.

Accordingly, since the photo-diode 111 is disposed among so-called lattices composed of row-directed lines of the gate electrode 59 and column-directed lines of the same, the formation of a photo-diode 111 provided with a light detecting portion having so-called isotropic expansion can be facilitated, in which, for example, a ratio of the short and long sides of a square-like light detecting portion approaches 1.

Figure 21:
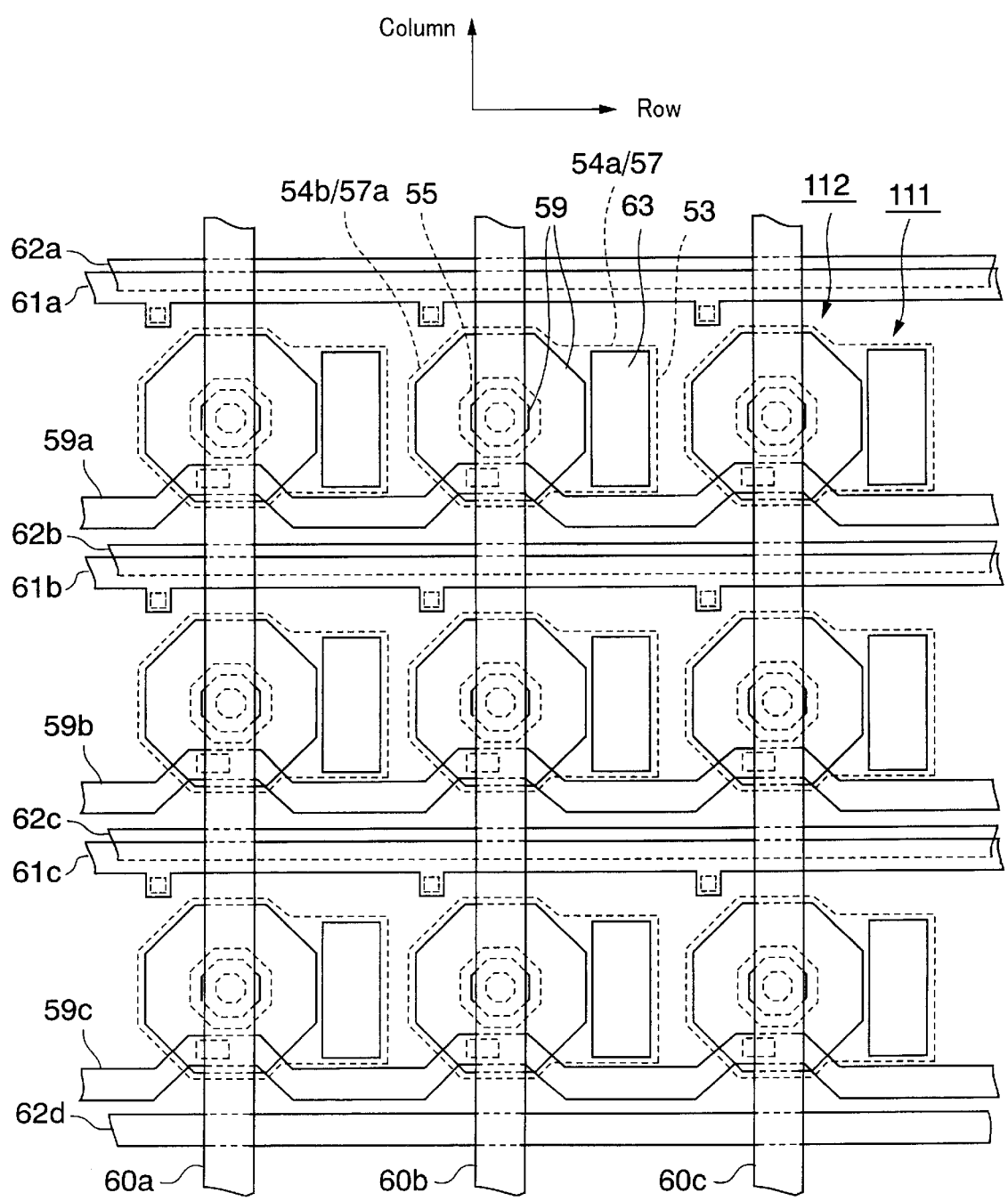
FIG. 21 is a plan view showing an element layout in a pixel of a solid-state imaging device of a seventh embodiment of the present invention.
Figure 22A:
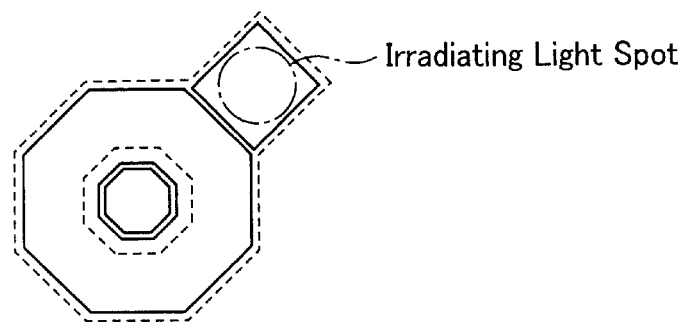
FIGS. 22A to 22C are plan views comparing another embodiments and the seventh embodiment.

In the case of reducing pixel pitches while a forming area of the gate electrode 59 is secured, when pixels, as shown in FIG. 21, are arranged without any contrivance, the light detecting portion becomes thin and long rectangular shape. Therefore, an irradiation optical spot, as shown in FIG. 22A, is easy to be moved out of the light detecting portion to cause a reduction in the output of an optical electric signal from the pixel. On the other hand, in the above pixel arrangement of this embodiment, since the photo-diode 111 provided with a light detecting portion having more isotropic expansion is obtained, an irradiation optical spot is set in the light detecting portion as shown in FIGS. 22A. Thus, it is possible to prevent a reduction in the output of an optical electric signal from the pixel and a lack of uniformity of outputs among pixels, which are caused by the case where the irradiation optical spot can no longer be fit on the light detecting portion.

(Fourth Embodiment)

Another pixel array is described in the fourth embodiment. The array is equivalent to that in FIGS. 8 to 10 of the second embodiment.

Figure 17:
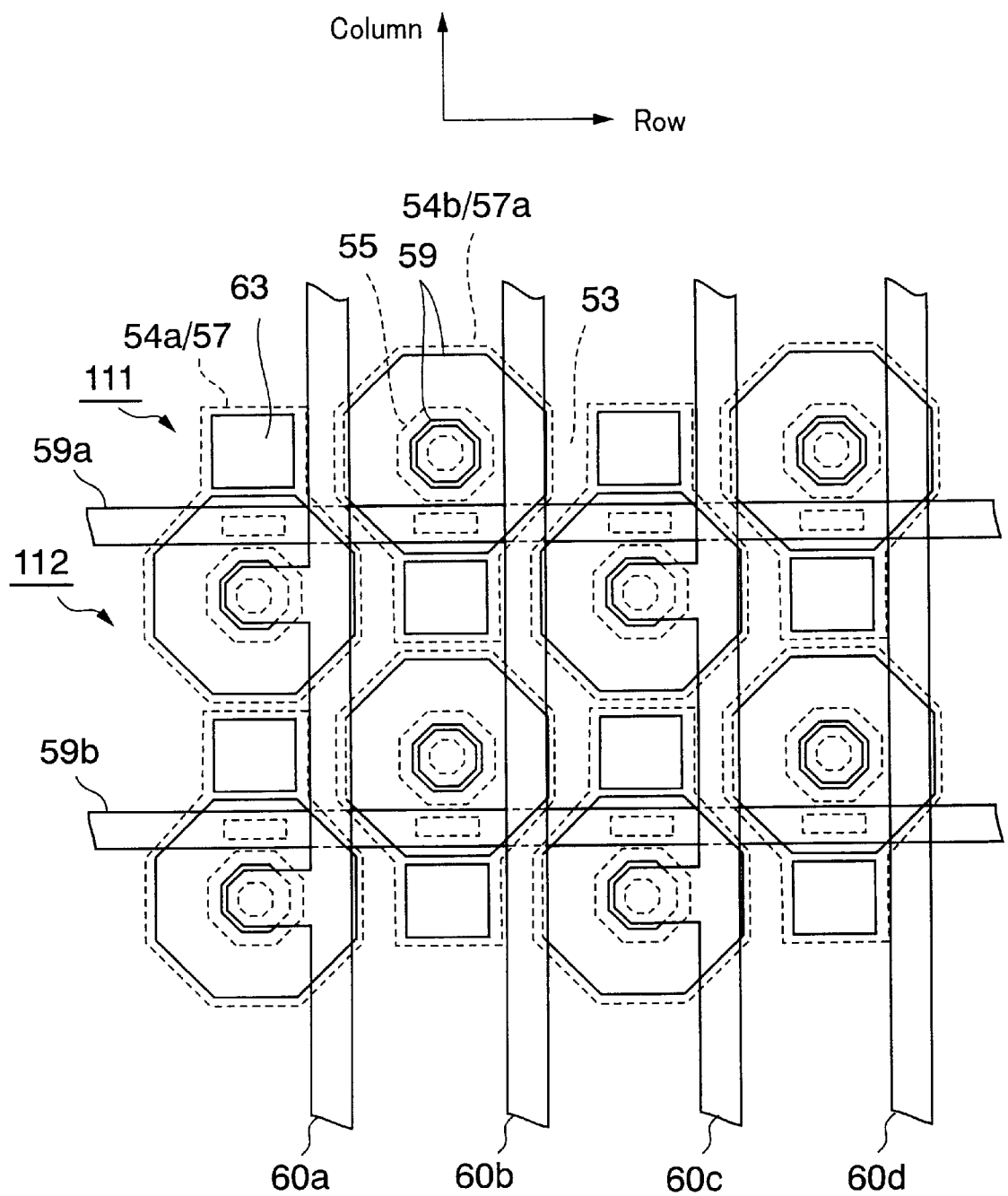
FIG. 17 is a plan view showing an element layout in a pixel of a solid-state imaging device according to a fourth embodiment of the present invention.

FIG. 17 is a plan view showing a pixel array in a MOS image sensor according to a fourth embodiment of the invention.

In FIG. 17, the different point from the third embodiment is that a direction from the gate electrode 59 of the PXMOS-FET 112 to the photo diode 111 coincides with a parallel direction with regard to the column direction, and an arrangement of the photo diodes in the same row has a zigzag manner along the row direction. In this case, directions from the gate electrodes 59 of the PXMOSFETs 112 to the photo diodes 111 between the adjacent pixels turn to the opposite directions each other.

In other words, an arrangement of the photo diodes in the same column comprises of one column-directed line in which the photo diodes are arranged with a pitch Pr, and an arrangement of the photo diodes in the same row comprises of two row-directed lines in which the photo diodes are arrayed with a pitch Pc respectively. In addition, the two row-directed lines has an pitch of 1/2 Pr, and are shifted by 1/2 Pc in the row direction with respect to each other. The gate electrodes 59 belonging to the two row-directed lines are connected alternately from upper to lower and from lower to upper in order along the row direction.

On the other hand, the following point in the fourth embodiment is same as the third embodiment. That is, the gate electrode 59 of a PXMOSFET 112 in the pixel 101, and the gate electrodes 59 of the PXMOSFETs 112 of adjacent pixels are disposed at four directions around a periphery of the photo-diode 111 and, conversely, the photo-diode 111 in the pixel, and the photo-diodes 111 of the adjacent pixels are disposed at four directions around a periphery of the gate electrode 59 of the PXMOSFET 112.

The other feature is that the pixel 101 is surrounded with a diffusing isolation region 53 having conductivity similar to that of a drain region 57a and formed deeper than first and second well regions 54a and 54b. This point is also similarly to the third embodiment.

Other portions of FIG. 17, denoted by reference numerals same as those in FIGS. 11 and 13, represent components same as those of FIGS. 11 and 13, and description thereof will be omitted.

Further, since the sectional structure of the pixel 101 is also the same as that of the pixel shown in FIG. 13, description thereof will be omitted.

The features according to the fourth embodiment are similar to those according to the third embodiment except for the zigzag manner. Accordingly, the fourth embodiment provides advantages similar to the third embodiment with respect to the corresponding features. In particular, the gate electrode 59 and the photo diode 111 are arranged alternately along the row and column directions. With this, it is possible to reduce the row pitch, the column pitch or both while securing a forming area of the photo diode 111 provided with a light detecting portion having isotropic expansion and a sufficient forming area of the gate electrode 59.

On the other hand, according to the fourth embodiment, the photo-diodes 111 are arrayed in a zigzag manner along the row direction.

The arrangement like that shown in FIG. 17, i.e., the zigzag arraying in which the photo-diodes 111 are arranged in the zigzag manner, has an advantage similar to that of so-called pixel shifting in the three-plate solid-state imaging device using the CCD device. In other words, another light detecting portion is substantially provided between the light detecting portions in the regular arrangement. Compared with a light signal in the regular arrangement, a light signal between the light detecting portions is also captured. Thus, it is possible to improve resolution by the single-plate system.

Figure 15:
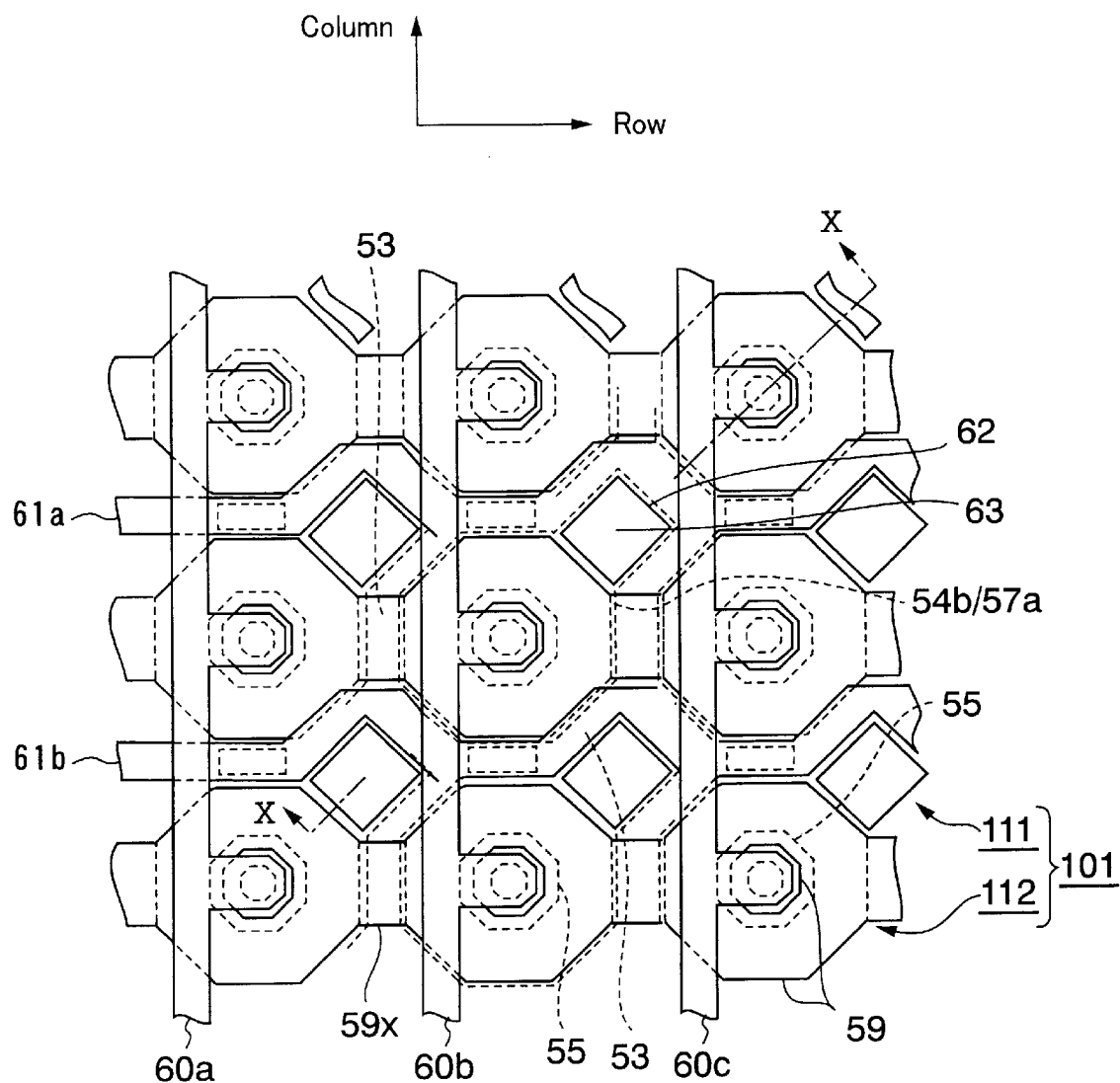
FIG. 15 is a plan view showing an element layout in a pixel of another solid-state imaging device of the third embodiment.

According to the fourth embodiment, as shown in FIGS. 12 and 15, instead of the VSCAN supply line 59a, a connection portion 59x may be provided to connect adjacent gate electrodes 59. Similarly to the third embodiment, the connection portion 59x is formed by patterning the same material as that of the gate electrode 59, simultaneously, for example, when the gate electrode 59 is formed by patterning.

Besides, VDD supply lines 61a, 61b, . . . may be provided above the diffusing isolation region 53 as shown in FIG. 14, FIG. 15 to connect with the drain region 57a through contacting VDD supply lines 61a, 61b, . . . and the diffusing isolation region 53.

Further, as shown in FIGS. 14 and 15, the example of the pixel arrangement as shown in FIG. 8 were described. However, a pixel arrangement as shown in FIGS. 9 or 10 may be applied to the pixel arrangement of FIG. 17. In the case of FIG. 9, a gate electrode 59 is formed wide on the row direction, and in the case of FIG. 10, a gate electrode 59 is formed long on the column direction. These arrangement are suited for increasing a storing capacity in the heavily doped buried layer (hole pocket).

(Fifth Embodiment)

In the fifth embodiment, the modulated example with respect to the pixel arrangement of the fourth embodiment is described. The pixel arrangement is equivalent to that of the second embodiment shown in any one of FIGS. 8 to 10.

Figure 18:
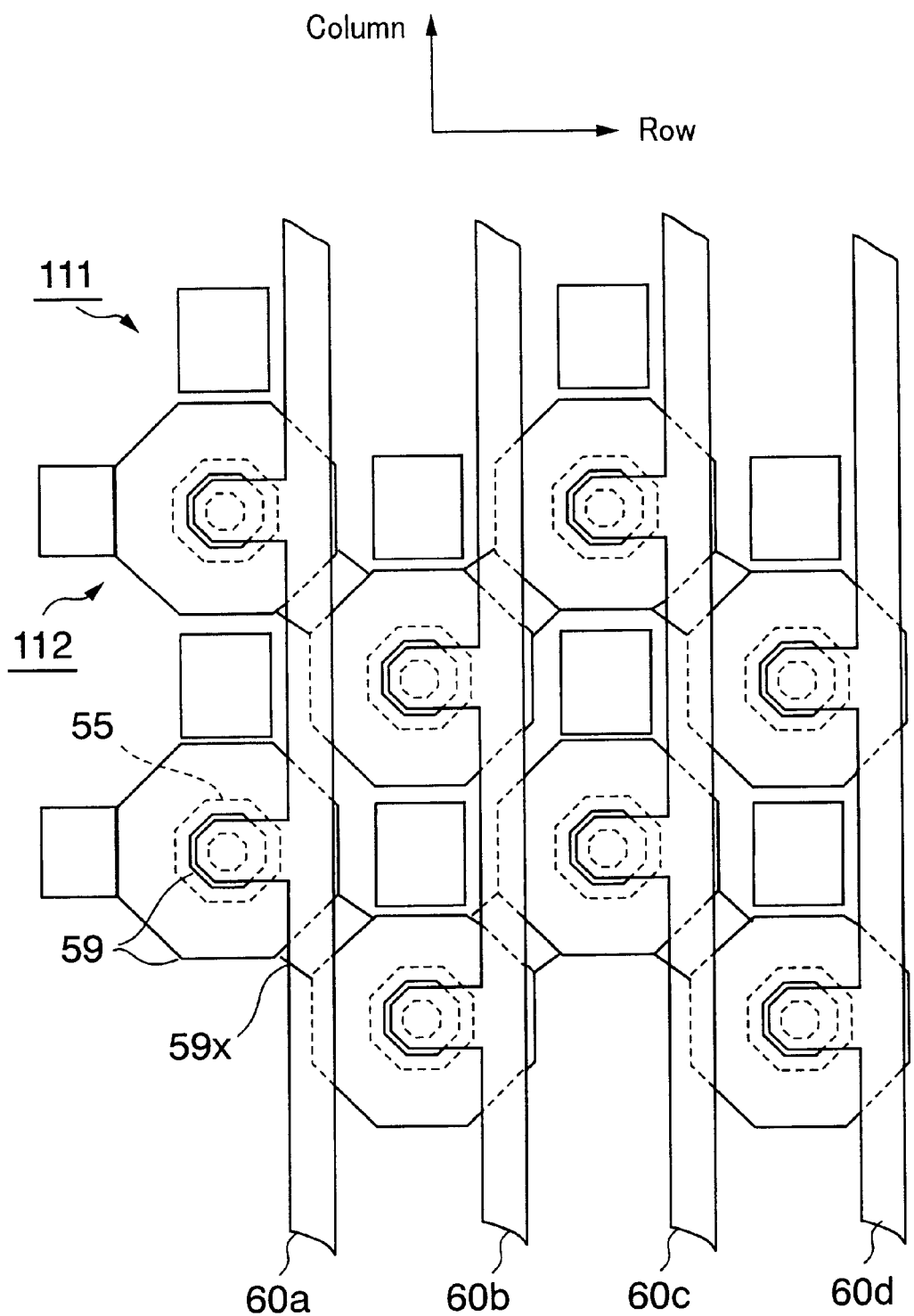
FIG. 18 is a plan view showing an element layout in a pixel of a solid-state imaging device according to a fifth embodiment of the present invention.

FIG. 18 is a plan view showing a pixel array in a MOS image sensor according to the fifth embodiment of the invention.

In FIG. 18, it is characterized in that a direction from the gate electrode 59 of the PXMOSFET 112 to the photo diode 111 coincides with a parallel direction to the column direction, and a direction from the gate electrodes 59 to the photo diodes 111 between the adjacent pixels 101 turn to the same direction.

This arrangement is equivalent to the fourth embodiment. That is, the gate electrode 59 of a PXMOSFET 112 in the pixel 101, and the gate electrodes 59 of the PXMOSFETs 112 of adjacent pixels are disposed at four directions around a periphery of the photo-diode 111 and, conversely, the photo-diode 111 in the pixel, and the photo-diodes 111 of the adjacent pixels are disposed at four directions around a periphery of the gate electrode 59 of the PXMOSFET 112. The photo-diodes 111, and the gate electrodes 59 of a PXMOSFETs 112 are arranged in the zigzag manner in the same row.

The other feature is that the pixel 101 is surrounded with a diffusing isolation region 53 having conductivity similar to that of a drain region 57a and formed deeper than first and second well regions 54a and 54b. This point is also similarly to the third and fourth embodiments.

Further, it is characterized in that the connection portion 59x connecting the gate electrodes 59 is formed of the same material, similarly to the third embodiment. In this case, similarly to the third embodiment, the connection portion 59x is formed by patterning the same material as that of the gate electrode 59, simultaneously, for example, when the gate electrode 59 is formed by patterning.

The second well region 54b, the impurity region 57 and the drain region 57a indicated by dotted lines in FIGS. 11, 12, 14, 15 and 17 are also present around the gate electrode 59 in FIG. 18, as in the case of FIGS. 11, 12, 14, 15 and 17. However, these portions are omitted in FIG. 18.

Other portions in FIG. 18, denoted by reference numerals same as those in FIG. 17, represent components same as those of FIG. 17, and description thereof will be omitted.

Since the sectional structure of the pixel 101 is the same as that of the pixel shown in FIG. 13, description thereof will be omitted.

As described above, the pixel arrangement of the fifth embodiment of the present invention has equivalent constitution same as that of the fourth embodiment. With this, the advantage same as that of the fourth embodiment can be obtained.

Since the other features are same as that of the third and fourth embodiments, the advantage same as that of the third and fourth embodiments can be obtained.

Besides, in FIG. 18, VDD supply lines 61a, 61b, . . . may be provided above the diffusing isolation region 53 as shown in FIG. 14, FIG. 15 to connect with the drain region 57a through contacting VDD supply lines 61a, 61b, . . . and the diffusing isolation region 53.

Further, in place of the connection portion 59x connecting the gate electrodes 59 in the same row, a metal interconnection may be employed as shown in FIG. 11, FIG. 14.

(Sixth Embodiment)

In the sixth embodiment, another modulated example with respect to the pixel arrangement is described. The pixel arrangement is equivalent to that of the second embodiment shown in any one of FIGS. 8 to 10.

Figure 19:
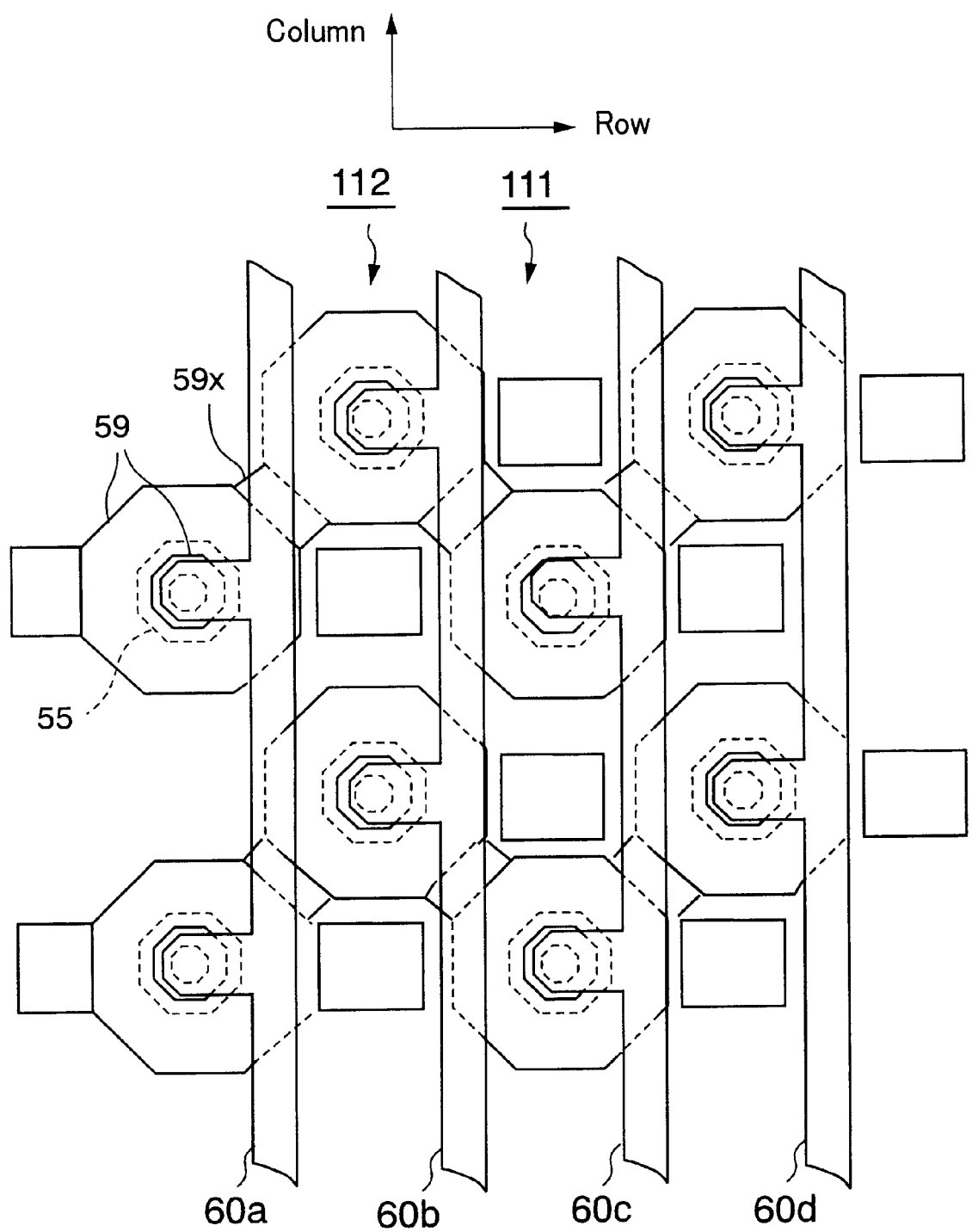
FIG. 19 is a plan view showing an element layout in a pixel of a solid-state imaging device of the fifth embodiment.

FIG. 19 is a plan view showing a pixel array in a MOS image sensor according to a sixth embodiment of the invention.

The feature of the pixel arrangement in FIG. 19 is that in the pixel 101, a direction extending from the gate electrode 59 of the PXMOSFET 112 to the photo-diode 111 coincides with a direction parallel with a row direction, and a direction from the gate electrodes 59 to the photo diodes 111 between the adjacent pixels 101 turn to the same direction.

This arrangement is equivalent to the third to fifth embodiments. That is, the gate electrode 59 of a PXMOSFET 112 in the pixel 101, and the gate electrodes 59 of the PXMOSFETs 112 of adjacent pixels are disposed at four directions around a periphery of the photo-diode 111 and, conversely, the photo-diode 111 in the pixel, and the photo-diodes 111 of the adjacent pixels are disposed at four directions around a periphery of the gate electrode 59 of the PXMOSFET 112.

Further, the photo-diodes 111, and the gate electrodes 59 of a PXMOSFETs 112 are arranged in the zigzag manner in the same row. This arrangement is equivalent to the fourth and fifth embodiments.

The other feature is that the pixel 101 is surrounded with a diffusing isolation region 53 having conductivity similar to that of a drain region 57a and formed deeper than first and second well regions 54a and 54b. This point is also similarly to the third to fifth embodiments.

Further, it is characterized in that the connection portion 59x connecting the gate electrodes 59 is formed of the same material, similarly to the third embodiment. In this case, similarly to the third embodiment, the connection portion 59x is formed by patterning the same material as that of the gate electrode 59, simultaneously, for example, when the gate electrode 59 is formed by patterning.

The second well region 54b, an impurity region 57 and the drain region 57a indicated by dotted lines in FIGS. 11, 12, 14, 15 and 17, are present around the gate electrode 59 in FIG. 19 as in the cases of FIGS. 11, 12, 14, 15 and 17. However, it is omitted in FIG. 19.

Other portions of FIG. 19, denoted by the same reference numerals as those in FIGS. 11 and 13, represent the same components as those of FIGS. 11 and 13, and description thereof will be omitted.

Since the sectional structure of the pixel 101 is also similar to that of the pixel shown in FIG. 13, description thereof will be omitted.

Figure 20:
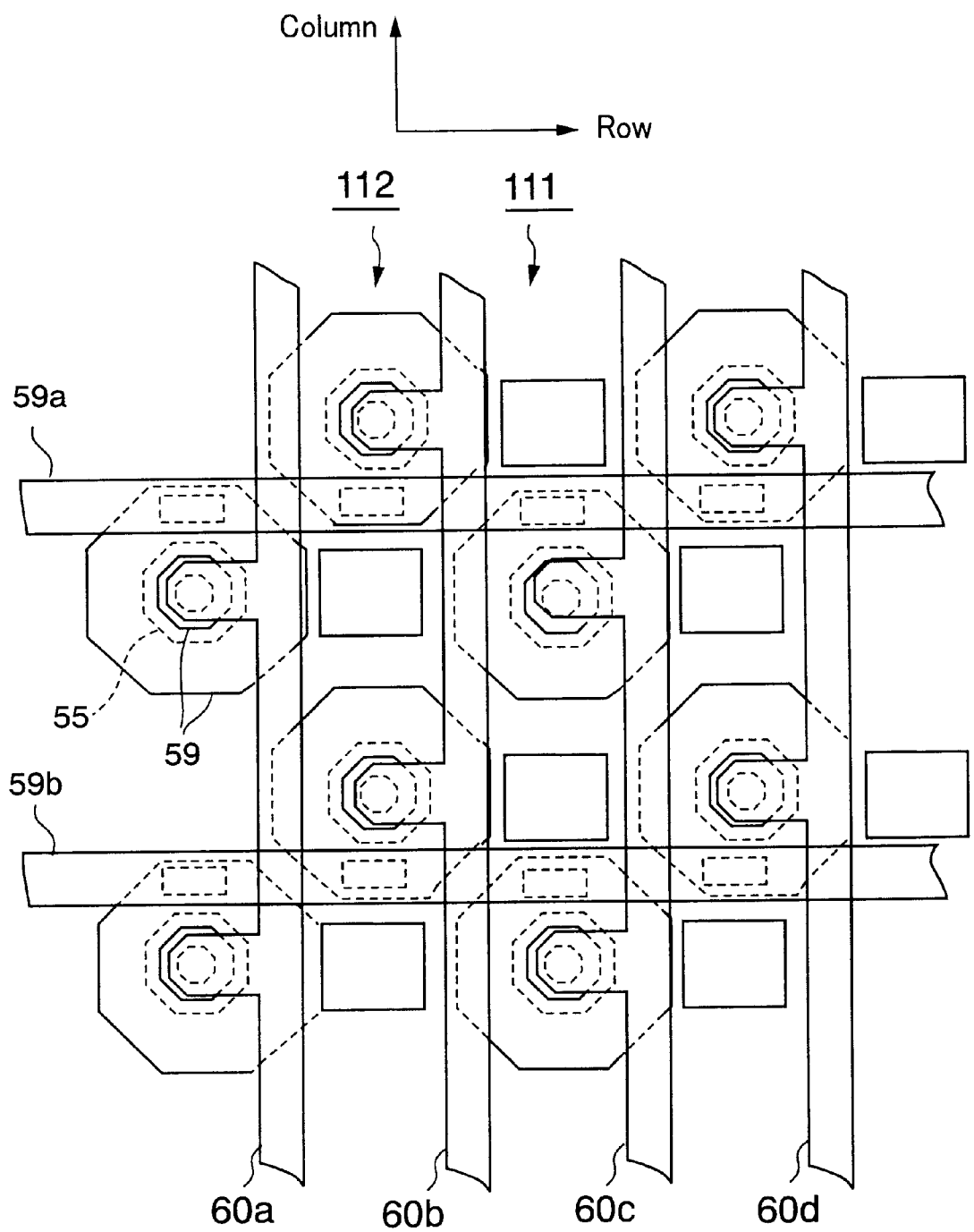
FIG. 20 is a plan view showing an element layout in a pixel of a solid-state imaging device according to a sixth embodiment of the present invention.

Next, another constitution different from that shown in FIG. 19 will be described by referring to FIG. 20. FIG. 20 is a plan view showing another structure different from that shown in FIG. 19.

Different from the structure of FIG. 19, instead of connecting the gate electrodes 59 to each other by the connection portion 59x, the gate electrodes 59 are interconnected through the VSCAN supply lines 59a, 59b, . . . . This feature is same as that in FIG. 11, FIG. 14 of the third embodiment, and the fourth embodiment.

In FIG. 20, portions denoted by reference numerals same as those of FIG. 19 represent components same as those of FIG. 19.

As described above, the pixel arrangement of the sixth embodiment of the present invention has equivalent constitution same as that of the third to fifth embodiments. With this, the advantage same as that of the third to fifth embodiments can be obtained.

Since the other features are equivalent to that of any one of the third to fifth embodiments, the advantage same as that of the third to fifth embodiments can be obtained from corresponding features.

Besides, in FIG. 19, FIG. 20, VDD supply lines 61a, 61b, . . . may be provided above the diffusing isolation region 53 as shown in FIG. 14, FIG. 15 to connect with the drain region 57a through contacting VDD supply lines 61a, 61b, . . . and the diffusing isolation region 53.

A direction from the gate electrode 59 to the photo diode 111 between the adjacent pixels may be made to turn to the opposite directions to each other.

(Seventh Embodiment)

FIG. 21 is a plan view showing a pixel array in a MOS image sensor according to the seventh embodiment.

Pixels 101 are arrayed in a matrix form such that photo-diodes 111 and PXMOSFETs 112 can be directed in a direction similar to a row direction. The pixels are isolated by the diffusing isolation region 53 in the one row. On the other hand, the row lines are isolated by an isolation region between rows formed of an insulating isolation film 62b on the surface.

In this embodiment, since the adjacent pixels 101 are isolated from each other only by the diffusing isolation region 53 without using any insulating films by the LOCOS method, the pixels 101 can be microfabricated without forming any extra regions such as bird's beak.

In this case, different from the third to sixth embodiments, pixels 101 are arrayed in a matrix form such that photo-diodes 111 and PXMOSFETs 112 can be directed in a row direction. Therefore, photo-diodes 111 and gate electrodes 59 are respectively arrayed straight along a column direction.

When one pixel is microfabricated in a row pitch while securing a forming area of the gate electrode 59 in the pixel 101, a light detecting portion 111, as shown FIG. 21, becomes thin and long rectangular shape. When an irradiation optical spot is circular in shape, there is no drawback if an optical spot diameter is contained in the light-detecting portion in the short side direction of the same. However, there is fear that an irradiation optical spot is out of the light-detecting portion as microfabrication is further advanced. In this case, this arrangement may become disadvantageous as follows.

Figure 22B:
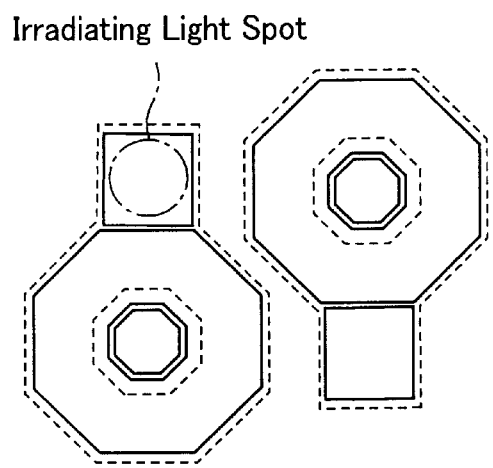
Figure 22C:
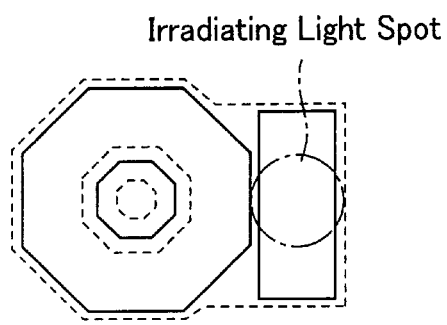

In the pixel array like that of each of the third to sixth embodiments, the photo-diode 111 provided with a light detecting portion having a more isotropic expansion can be obtained. Thus, as represented by the pixel of each of the third and fourth embodiments shown in FIGS. 22A and 22B, an irradiation optical spot can be contained in the light detecting portion. Therefore, the pixel arrays of the third to sixth embodiments are more advantageous for preventing a reduction in the output of an optical electric signal from the pixel 101 and a lack of uniformity of the output among pixels, caused by the reason why the irradiation optical spot is out of the light-detecting portion.

The present invention has been described in detail with reference to the embodiments. However, the invention is not limited to the foregoing specific embodiments, and various modifications and changes thereof can be made within the teachings of the invention.

For example, in the foregoing embodiments, the planar shape of the peripheral edge part of the gate electrode 59 is octagonal. However, other than the octagonal shape, a polygonal shape having four or more sides, or a circular shape may be used.

Further, various modified examples are possible regarding the structure of the pixel 101, to which the invention is applied. In such a case, it is only necessary that a photo-diode 111 and a PXMOSFET 112 for light signal detection are arranged adjacently to each other to constitute one pixel 101, gate electrodes 59 of PXMOSFETs 112 being disposed in four directions around the periphery of the photo-diode 111, and the photo-diodes 111 being disposed in four directions around the periphery of the gate electrode 59 of the PXMOSFET 112.

Moreover, instead of the p-type substrate 51, an n-type substrate may be used. In this case, to obtain an advantage similar to that of each of the foregoing embodiments, it is only necessary to reverse all the conductive types of the respective layers and regions described above with reference to the embodiments. In such a case, carriers to be stored in a carrier pocket 55 are electrons, among electrons and holes.

As can be understood from the foregoing, according to the invention, since a device isolation region for isolating adjacent unit pixels carries out device isolation only by a diffusing isolation region without using an isolation insulating film of a LOCOS method, a unit pixel can be microfabricated without rendering any extra regions necessary for the LOCOS method.

In addition, the pixels provided with the PXMOSFETs for light signal detection are arrayed in a matrix form, gate electrodes 59 of PXMOSFETs 112 are disposed in four directions around the periphery of the photo-diode 111, and the photo-diodes 111 are disposed in four directions around the periphery of the gate electrode 59 of the PXMOSFET 112.

Accordingly, a formation of a photo-diode provided with a light detecting portion having a so-called isotropic expansion can be facilitated, in which a ratio of the short and long sides of, for example a square light detecting portion approaches 1. As a result, it is possible to prevent so-called shading, in which the irradiation optical spot can no longer be fit on the light detecting portion, causing a reduction in the output of an optical electrical signal from the pixel.

In addition, in the planar arrangement of the pixels in the solid-state imaging device, the photo-diodes and the gate electrodes are alternately arrayed along the row and column directions.

In this case, especially, in the same row, the pixels are arrayed straight along the row direction, and the gate electrodes of the PXMOSFETs are arrayed in a zigzag manner along the row direction. Moreover, especially, other than the arraying of the gate electrodes of the PXMOSFETs, in the same row, the pixels are arrayed in a zigzag manner along the row direction.

Because of the zigzag arraying of the centers of the photo-diodes, another light detecting portion is substantially provided between the adjacent light detecting portions. Therefore, it is possible to enhance resolution by the single-plate system.

What is claimed is:

1. A solid-state imaging device for detecting a light signal by modulating a threshold voltage, comprising a plurality of pixels arranged, each of the pixels including a photo diode and an insulated gate field effect transistor for light signal detection adjacent to the photo diode, which are formed in a well region, the insulated gate field effect transistor for light signal detection provided with:
   (a) a ring-shaped gate electrode formed on a gate insulating film;
   (b) a source region formed in the well region inside an inner peripheral part of the gate electrode;
   (c) a drain region formed in the well region outside an outer peripheral part of the gate electrode;
   (d) a channel region formed below the gate electrode between the drain region and the source region;
   (e) a heavily doped buried layer formed in the well region below the channel region and near the source region, for storing the photo-generated charges generated by light irradiation at the photo diode,
   wherein a diffusing isolation region is provided between the adjacent pixels, has a same conductivity as that of the drain region, and is connected with the drain region.

2. A solid-state imaging device according to claim 1, wherein the heavily doped buried layer is formed to surround the source region.

3. A solid-state imaging device according to claim 1, wherein the diffusing isolation region is formed deeper than the well region.

4. A solid-state imaging device according to claim 1, wherein the photo diode is provided with an impurity region being formed on the well region, having the same conductivity as that of the drain region, and being connected with the drain region.

5. A solid-state imaging device according to claim 1, wherein a planar shape of the outer peripheral part of the gate electrode is polygonal having four or more sides, alternatively circular.

6. A solid-state imaging device according to claim 5, wherein the photo-diode is provided adjacently to at least one side of the polygonal shape of the gate electrode, alternatively adjacently to a part of a circumference of the circular shape.

7. A solid-state imaging device according to claim 1, wherein a plurality of pixels are arrayed in a matrix form.

8. A solid-state imaging device according to claim 7, wherein the gate electrodes of the insulated gate field effect transistors are arranged at four directions around a periphery of the photo-diode, and the photo-diodes are arranged at four directions around a periphery of the gate electrode of the insulated gate field effect transistor.

9. A solid-state imaging device according to claim 8, wherein a direction from the gate electrode to the photo diode in the pixel coincides with an oblique direction with respect to the column and row directions, alternatively with a parallel direction with respect to the column or row direction.

10. A solid-state imaging device according to claim 9, wherein the gate electrodes of the insulated gate field effect transistors are connected with each other while an arrangement of the photo diodes belonging to the gate electrodes connected with each other form one row, and the source regions of the insulated gate field effect transistors are connected with each other while an arrangement of the photo diodes belonging to the source regions connected with each other form one column.

11. A solid-state imaging device according to claim 10, wherein the gate electrodes on the same row are connected with each other by connection portions which are made of a material similar to that of the gate electrode.

12. A solid-state imaging device according to claim 10, wherein the drain regions on the same row are connected with each other by a metal interconnection.

13. A solid-state imaging device according to claim 9, wherein a direction from the gate electrode to the photo diode in the pixel coincides with an oblique direction with respect to the row and column directions, and the photo diodes are put at intersecting points among row-directed lines extending to the row direction at regular pitchs and column-directed lines extending to the column direction at regular pitchs.

14. A solid-state imaging device according to claim 9, wherein a direction from the gate electrode to the photo-diode coincides with a parallel direction with regard to the row or column direction, and the photo diode and the gate electrodes are alternately arranged on a row-directed line and a column-directed line.

15. A solid-state imaging device according to claim 14, wherein the photo diodes are arrayed with a pitch Pc on one row-directed line and with a pitch Pr on one column-directed line, the adjacent two row-directed lines with respect to the photo diodes are apart from each other with an pitch of 1/2 Pr, and the adjacent two column-directed lines with respect to the photo diodes are apart from each other with an pitch of 1/2 Pc, and the adjacent two row-directed lines with respect to the photo diodes make one row.

16. A solid-state imaging device according to claim 14, wherein the photo diodes are arrayed with a pitch 2×Pr on one column-directed line and with a pitch Pc on one row-directed line, the adjacent two column-directed lines with respect to the photo diodes are apart from each other with a pitch of 1/2 Pc, and the adjacent two row-directed lines with respect to the photo diodes are apart from each other with a pitch of Pr.

17. A solid-state imaging device according to claim 14, wherein the photo diodes are arrayed with a pitch Pr on same column-directed line and with a pitch 2×Pc on same row-directed line, the adjacent two column-directed lines with respect to the photo diodes are apart from each other with a pitch of Pc, and the adjacent two row-directed lines with respect to the photo diodes are apart from each other with a pitch of 1/2 ×Pr.

18. A solid-state imaging device according to claim 1, wherein the solid-state imaging device further including:

a scanning driver circuit for a vertical scanning signal, adapted to supply a scanning signal to the gate electrode of the insulating gate field effect transistor for light signal detection;

a drain voltage driving scanning circuit adapted to supply a drain voltage to the drain region of the insulating gate field effect transistor;

a signal output circuit adapted to store a voltage of the source region, and output an light signal corresponding to the voltage of the source region; and an input scanning circuit for a horizontal scanning signal, adapted to supply a scanning signal for controlling a timing of reading the light signal.

* * * * *